United States Patent
Vanberg et al.

(10) Patent No.: US 9,970,720 B2
(45) Date of Patent: May 15, 2018

(54) METHOD FOR MONITORING A HEAT EXCHANGER UNIT

(71) Applicant: GLOBAL HEAT TRANSFER ULC, Edmonton (CA)

(72) Inventors: Randy Vanberg, Tomball, TX (US); Hamid Reza Zareie Rajani, Edmonton (CA); Seyed Reza Larimi, Edmonton (CA); Morteza Abbasi, Edmonton (CA)

(73) Assignee: GLOBAL HEAT TRANSFER ULC, Edmonton, CA (US)

( * ) Notice: Subject to any disclaimer, the term of this patent is extended or adjusted under 35 U.S.C. 154(b) by 0 days. days.

(21) Appl. No.: 15/616,153

(22) Filed: Jun. 7, 2017

(65) Prior Publication Data

US 2017/0292803 A1    Oct. 12, 2017

Related U.S. Application Data

(63) Continuation of application No. 15/591,086, filed on May 9, 2017, which is a continuation-in-part of application No. 15/477,097, filed on Apr. 2, 2017.

(Continued)

(51) Int. Cl.
*F22B 37/00*    (2006.01)
*F28G 15/00*    (2006.01)
(Continued)

(52) U.S. Cl.
CPC ............ *F28G 15/003* (2013.01); *F28F 27/00* (2013.01); *G06F 1/206* (2013.01); *H01L 23/467* (2013.01);
(Continued)

(58) Field of Classification Search
CPC ...... F28G 15/003; F28F 27/00; H01L 23/467; B60K 11/08; F04D 19/002; F28D 1/024;
(Continued)

(56) References Cited

U.S. PATENT DOCUMENTS 2,505,999 A  *  5/1950  Smith ................. F02B 23/0627
                                                      123/262
4,747,275 A  *  5/1988  Amr ...................... F24F 1/0007
                                                       165/121

(Continued)

FOREIGN PATENT DOCUMENTS

WO    WO2016079674    5/2016

OTHER PUBLICATIONS

Enerflow 3512 frac truck brochure, L&M Radiator Inc., copyright notice dated 2011 (2 pgs).

(Continued)

*Primary Examiner* — Len Tran
*Assistant Examiner* — Gordon Jones
(74) *Attorney, Agent, or Firm* — Rao DeBoer Osterrieder, PLLC; John M. DeBoer

(57) ABSTRACT

Embodiments of the disclosure pertain to a method for monitoring a heat exchanger unit that may include the steps of: associating a monitoring module with an airflow side of the heat exchanger unit; operating the monitoring module whereby a microcontroller performs tasks related to data acquisition, data comparison, and providing an indication; and taking an action based on the indication. The monitoring module includes an at least one sensor proximate to the airflow side; a logic circuit in operable communication with the at least one sensor, and further comprising the microcontroller.

20 Claims, 6 Drawing Sheets

Related U.S. Application Data

(60) Provisional application No. 62/320,606, filed on Apr. 10, 2016, provisional application No. 62/320,611, filed on Apr. 10, 2016.

(51) Int. Cl.
| | |
|---|---|
| *F28F 27/00* | (2006.01) |
| *H01L 23/467* | (2006.01) |
| *B60K 11/08* | (2006.01) |
| *F04D 19/00* | (2006.01) |
| *G06F 1/20* | (2006.01) |
| *F28D 21/00* | (2006.01) |
| *F28D 1/04* | (2006.01) |
| *F28D 1/02* | (2006.01) |

(52) U.S. Cl.
CPC ............ *B60K 11/08* (2013.01); *F04D 19/002* (2013.01); *F28D 1/024* (2013.01); *F28D 1/04* (2013.01); *F28D 2021/008* (2013.01); *F28D 2021/0031* (2013.01); *F28D 2021/0091* (2013.01); *G06F 1/20* (2013.01)

(58) Field of Classification Search
CPC ............ F28D 1/04; F28D 2021/0031; F28D 2021/008; F28D 2021/0091; G06F 1/20; G06F 1/206
See application file for complete search history.

(56) References Cited

U.S. PATENT DOCUMENTS

| | | | |
|---|---|---|---|
| 5,526,871 A | 6/1996 | Musser et al. | |
| 5,879,466 A | 3/1999 | Creger et al. | |
| 6,126,681 A | 10/2000 | Van Duren et al. | |
| 6,240,774 B1 | 6/2001 | Niki et al. | |
| 6,286,986 B2 | 9/2001 | Grimland et al. | |
| 6,389,889 B1 | 5/2002 | Ford | |
| 6,630,756 B2 | 10/2003 | Kern et al. | |
| 6,644,844 B2 | 10/2003 | Neal et al. | |
| 6,681,619 B2 | 1/2004 | Alleving et al. | |
| 7,210,194 B2 | 5/2007 | Kiem | |
| 7,845,413 B2 | 12/2010 | Shampine et al. | |
| 8,215,833 B2 | 7/2012 | Kouda et al. | |
| 8,347,427 B2* | 1/2013 | Klicpera | B05B 12/008 4/643 |
| 8,649,931 B2 | 2/2014 | Nishizawa | |
| 9,103,193 B2 | 8/2015 | Coli et al. | |
| 9,109,594 B2 | 8/2015 | Pawlick | |
| 9,404,417 B2 | 8/2016 | Norrick et al. | |
| 2005/0159846 A1 | 7/2005 | Van Ostrand et al. | |
| 2011/0066298 A1 | 3/2011 | Francino et al. | |
| 2014/0008074 A1 | 1/2014 | Nevison | |
| 2014/0365195 A1* | 12/2014 | Lahiri | G06F 19/702 703/12 |
| 2015/0047811 A1 | 2/2015 | Kappelman et al. | |
| 2015/0252661 A1 | 9/2015 | Glass | |
| 2016/0146487 A1 | 5/2016 | Zywiak | |
| 2016/0305865 A1* | 10/2016 | Silva | G01N 17/008 |

OTHER PUBLICATIONS

World Academy of Science, Engineering and Technology, vol. 6 Nov. 28, 2012, "CFD Modeling of a Radiator Axial Fan for Air Flow Distribution", date of publication indicated as 2012 (6 pgs).

* cited by examiner

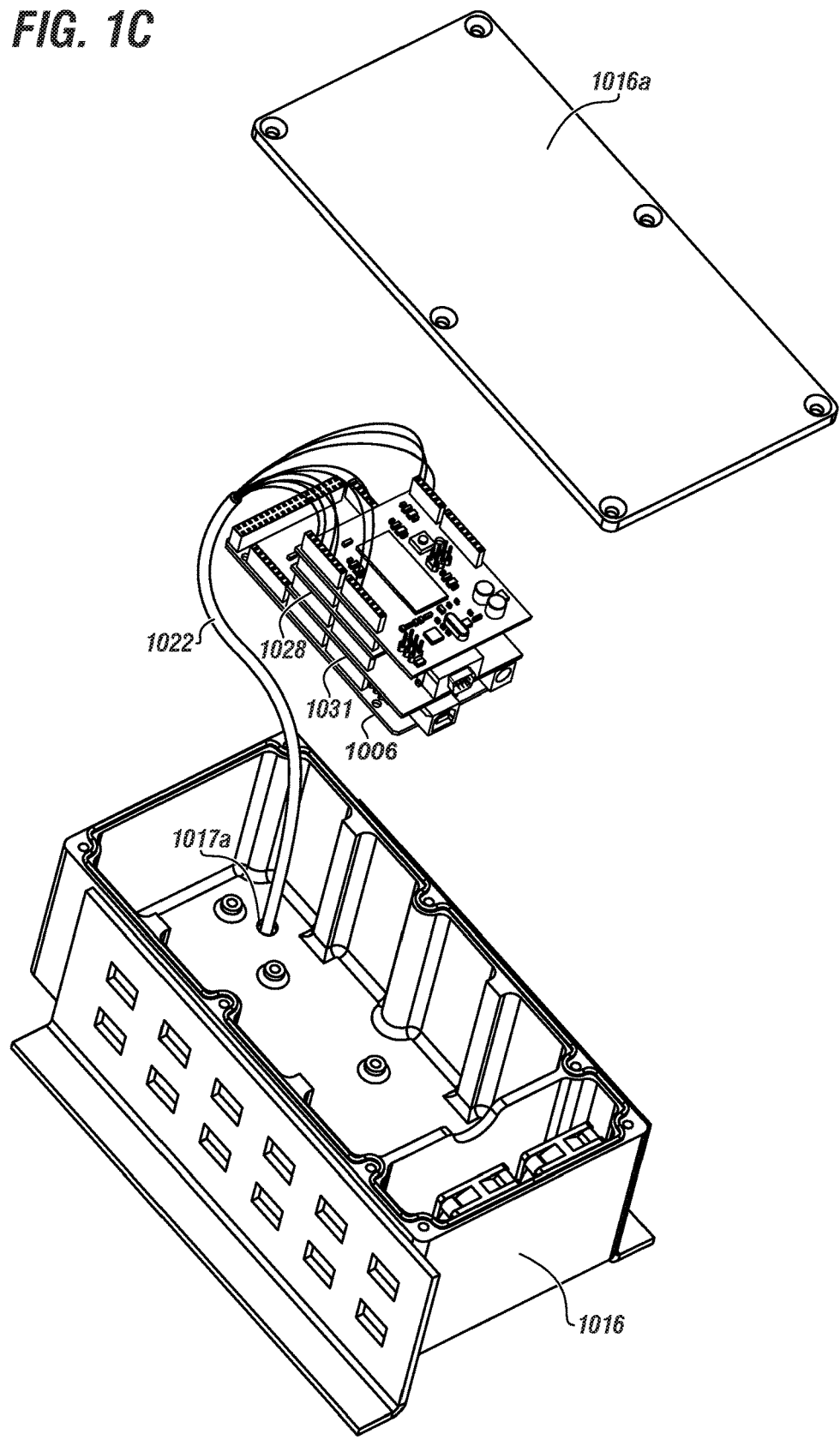

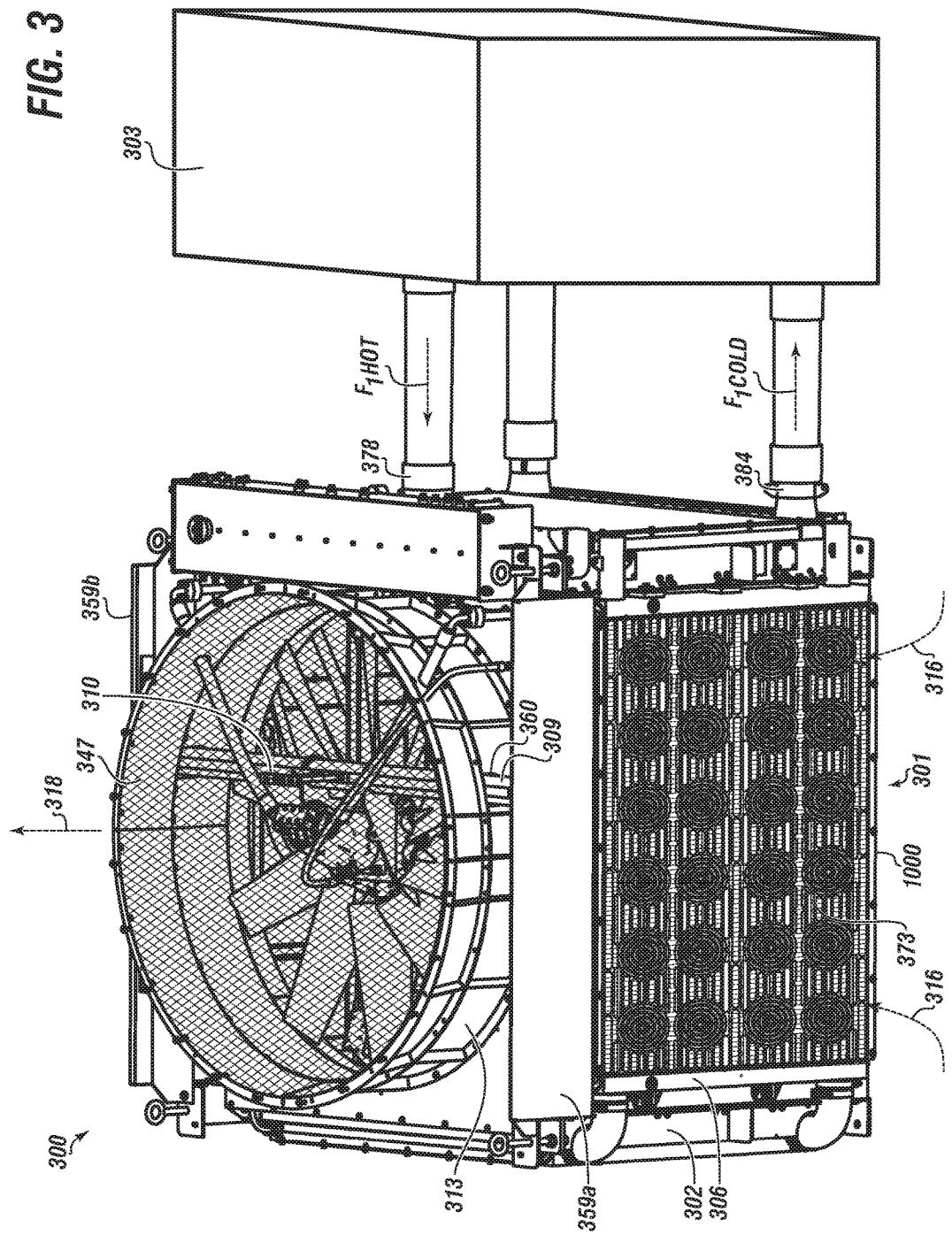

METHOD FOR MONITORING A HEAT EXCHANGER UNIT

CROSS-REFERENCE TO RELATED APPLICATIONS

This application is a continuation of U.S. non-provisional application Ser. No. 15/591,086, filed May 9, 2017, which is a continuation-in-part of U.S. non-provisional application Ser. No. 15/477,097, filed Apr. 2, 2017, which claims the benefit under 35 U.S.C. § 119(e) of U.S. Provisional Patent Application Ser. No. 62/320,606, filed on Apr. 10, 2016, and of U.S. Provisional Patent Application Ser. No. 62/320,611, filed on Apr. 10, 2016. The entirety of each application is incorporated herein by reference in entirety for all purposes.

INCORPORATION BY REFERENCE

The subject matter of co-pending U.S. non-provisional application Ser. Nos. 15/477,097 and 15/477,100, each filed Apr. 2, 2017, is incorporated herein by reference in entirety for all purposes.

STATEMENT REGARDING FEDERALLY SPONSORED RESEARCH OR DEVELOPMENT

Not Applicable.

BACKGROUND

Field of the Disclosure

This disclosure generally relates to a heat exchanger unit with characteristics of improved: airflow, noise reduction, cooling efficiency, and/or structural integrity. Other aspects relate to a system for monitoring airflow through a heat exchanger unit, or fouling related thereto. In particular embodiments, a monitoring module is mounted externally to the heat exchanger unit of a monitored system, the system being usable to monitor fouling of the unit, and provide an associated warning. The heat exchanger unit may be used for cooling various utility fluids used with a heat generating device, such as an engine, a pump, or a genset. Other embodiments pertain to a method of monitoring fouling, as well as a method for using a monitoring system.

Background of the Disclosure

Whether its refrigeration, hot showers, air conditioning, and so on, the function of heating and cooling is prevalent in today's residential and industrial settings. One area of relevance is the oil and gas industry, including exploration, upstream, and downstream operations where the ability to heat and/or cool is critical. Upstream operations can include drilling, completion, and production, whereas downstream operations can include refining and other related hydrocarbon processing, all of which utilize a vast amount of process equipment including that which provide heat transfer. To be sure, the background of the disclosure is relevant elsewhere, but for brevity discussion is focused on O&G.

Common settings are nothing short of challenging in the sense that in many instances operations and processes (and related equipment) are exposed to environmental conditions, such as extreme heat, cold, wind, and dust (including natural amounts of particulate, as well as that caused by the operation of equipment and vehicles).

It is routine to have (indeed, need) some type of heat exchange ability in such settings. As set forth in U.S. Ser. No. 15/477,097, an example operation in an industrial setting may include one or more frac pump units. Each unit is typically operable with a pump and engine mounted or otherwise disposed thereon, as well as a radiator (or analogously referred to as cooler, heat exchanger, etc.). As mentioned before, equipment like this must be rugged and durable in order to have long-term operational capacity and effectiveness.

The radiator is configured for cooling one or more hot service fluids associated with the equipment of the frac pump unit, such as lube oil or jacket water. The radiator typically includes a 'core' of stacked fins, with one part of the core providing a flow are for the service fluid(s), while another part of the core is provides a proximate, albeit separate, flow area for ambient air. A fan is used to blow or pull air through the stacked fins, the air being a low or moderate enough temperature to cool the service fluid, which is then recirculated in a loop.

The stacked fins often have a configuration that is tantamount to an extensive amount of small air passageways proximate to (albeit separate from) service fluid passageways, whereby the air and the service fluid can 'exchange heat' via the surface material of the stacked fins between the passageways (e.g., aluminum).

Over time airborne dirt in and other particulate in the air will begin to deposit on the air intake side (and elsewhere), resulting in a fouled radiator. Fouling can seriously deteriorate the capacity of the surface of the fins to transfer heat under the conditions for which they were designed. Among other problems, the fouling layer has a low thermal conductivity which increases the resistance to heat transfer and reduces the effectiveness of heat exchangers. In addition, fouling reduces the cross-sectional area in the passageways, which causes an increase in pressure drop across a heat exchanger.

Radiator fouling affects both capital and operating costs of heat exchangers (and overall processes). Higher capital expenditures include that for excess surface area (for heat transfer), extra space, and transport and installation costs. Operating expenditures include that for energy losses due to the decrease in thermal efficiency, increases in the pressure drop through process equipment, and production losses during planned and unplanned plant shutdowns for fouling cleaning.

Moreover, government emissions regulations are forcing engine manufacturers and their customers to reduce emissions from reciprocating engines. Current solutions involve returning the exhaust through heat exchange, which elevates combustion temperature and puts significantly more heat into the cooling system. Tier 4 Final (US and CA) Emission regulations come into effect in 2017 & 2020 will force end users into significant equipment redesign industry wide. See, e.g., http://www.assocpower.com/eqdata/tech/US-EPA-Tier-Chart_2004-2017.php, for general reference.

In summary, fouling of heat transfer surfaces is one of the most important problems in heat transfer equipment. Some have described fouling as the major unresolved problem in heat transfer. Equipment operators world-wide are also trying to reduce maintenance costs. One of the highest maintenance costs any piece of equipment has is cooling system maintenance.

And yet despite these detriments, consideration of improved remediation or management techniques have been largely ignored and unchanged. Conventional techniques include mitigation (such as upstream filtering) and chemical treatment.

Mechanical cleaning is also used, but only during predetermined periodic intervals, namely during a planned shutdown or when an exchanger reaches a point of failure and is no longer operable. This approach relies on extensive cost and resource being allocated toward the antiquated philosophy of operational redundancy.

There is a need in the art to overcome deficiencies and defects identified herein. There is a need in the art to reliably monitor fouling of a radiator. There is a need in the art to provide a real-time warning indication about fouling conditions of a radiator.

There is a need in the art for a monitoring system that is durable for use in outdoor and other difficult environmental conditions. There is a need in the art for a monitoring system capable of high degree of sensing accuracy, yet impervious to or otherwise able to withstand external conditions.

There is a need in the art for a method of doing business that includes monitoring and servicing of radiators, especially when the radiator reaches various stages of fouling or provides other indication requiring attention. There is a need in the art to clean a fouled radiator with little or no downtime.

There is a need in the art for a monitoring module that can be retrofitted to any existing heat exchanger, including of great importance to a heat exchanger that has one or more sides (or surfaces) exposed to ambient air.

There is a particular need in the art for a monitoring system that is readily adaptable and compatible to radiators associated with different pieces of heat generating equipment, such as an engine, a motor, a pump, or a genset useable in a wide range of settings.

SUMMARY

Embodiments of the disclosure pertain to a monitored heat exchanger system that may include a heat exchanger unit in operable engagement with a heat generating device. There may be an at least one service fluid being transferable therebetween. The heat exchanger unit may include a frame; and at least one cooler coupled with the frame. The at least one cooler may have an airflow side and a service fluid side.

The system may include a monitoring module coupled to the heat exchanger unit. The monitoring module may include: an at least one sensor; at least one controller housing; and a microcontroller disposed within the controller housing and in operable communication with the at least one sensor.

The at least one sensor may include a rotating member with a plurality of blades radially extending therefrom. The rotating member may be configured to generate a system signal proportional to an amount of rotation thereof.

The microcontroller may be provided with computer instructions for processing the system signal.

The at least one service fluid may be one of lube oil, hydraulic fluid, fuel, charge air, transmission fluid, jacket water, and engine cooler.

The system signal may pertain to an amount of fouling associated with the airflow side of the at least one cooler.

The monitoring module may include one or more of a solid data storage, a Wi-Fi module, a GSM module, and a CAN-Bus module, any of which may be disposed within the controller housing and in operable communication with the microcontroller. Accordingly the microcontroller may be provided with computer instructions for communicating with one or more of the solid data storage, the Wi-Fi module, the GSM module, and the CAN-Bus module.

In aspects, the heat generation device may be a diesel engine.

The microcontroller may be configured or otherwise programmed with computer instructions for performing one or more of the tasks of: acquiring a set of data from the at least one sensor; sampling the set of data over a predetermined period of time; computing an average and a standard deviation of the set of data; comparing the standard deviation with predetermined data; determining whether the set of data is acceptable within a defined parameter; determining whether a first lookup table comprising a set of lookup data has been completed, and creating the first lookup table using an averaging method if it has not; comparing the set of data to the set of lookup data; and providing an indication based on a result of the comparing the set of data to the set of lookup data step.

Other embodiments of the disclosure pertain to a monitored heat exchanger system that may include a heat exchanger unit in operable engagement with a heat generating device. There may be an at least one service fluid being transferable therebetween. The heat exchanger unit may include: a frame; and at least one cooler coupled with the frame. The at least one cooler may have a coolant side and a service fluid side.

The unit may have a monitoring module coupled therewith. The module may include an at least one sensor; and a microcontroller in operable communication with the at least one sensor. The at least one sensor may have a rotating member with a plurality of blades radially extending therefrom. The rotating member may be configured or otherwise operable to generate a system signal proportional to an amount of rotation thereof. The microcontroller may be provided with computer instructions for processing the system signal.

In aspects the coolant may be a liquid. In other aspects, the coolant may be air.

Yet other embodiments of the disclosure pertain to a heat exchanger unit in operable engagement with a heat generating device. There may be an at least one service fluid being transferable therebetween. The heat exchanger unit may have a frame; and at least one cooler coupled with the frame. The at least one cooler may have an airflow side and a service fluid side.

There may be a monitoring module coupled to the heat exchanger unit. The monitoring module may include: a cover panel; an at least one sensor coupled with the cover panel; at least one controller housing coupled with the cover panel; a microcontroller disposed within the controller housing and in operable communication with the at least one sensor; and one or more of a solid data storage, a Wi-Fi module, a GSM module, and a CAN-Bus module being disposed within the controller housing and in operable communication with the microcontroller.

The at least one sensor may include a rotating member configured to generate a system signal proportional to an amount of rotation of the rotating member.

The microcontroller may be provided with computer instructions for processing the system signal.

The microcontroller may be provided with computer instructions for communicating with one or more of the solid data storage, the Wi-Fi module, the GSM module, and the CAN-Bus module.

The microcontroller may be configured with computer instructions for performing the tasks of: acquiring a set of data from at least one of the plurality of sensors; sampling the set of data over a predetermined period of time; computing an average and a standard deviation of the set of data; comparing the standard deviation with predetermined data; determining whether the set of data is acceptable within a defined parameter; determining whether a first lookup table comprising a set of lookup data has been completed, and creating the first lookup table using an averaging method if it has not; comparing the set of data to the set of lookup data; and providing an indication based on a result of the comparing the set of data to the set of lookup data step.

Still other embodiments of the disclosure pertain to a method for monitoring a heat exchanger unit that may include one or more steps of coupling the heat exchanger unit with a heat generating device; associating a monitoring module with an airflow side of the heat exchanger unit; operating the heat exchanger unit and the heat generating device in a manner whereby an at least one service fluid is transferred therebetween; operating the heat exchanger unit to reduce a temperature of the at least one service fluid; operating the monitoring module whereby the microcontroller performs the data acquisition and data comparison tasks to resultantly generate an indication related to an amount of fouling on the airflow side; and taking an action based on the indication.

In aspects, the monitoring module may include an at least one sensor proximate to the airflow side; and a logic circuit in operable communication with the at least one sensor. The logic circuit may include a microcontroller configured with computer instructions for performing a set of tasks related to data acquisition and data comparison.

Other embodiments of the disclosure pertain to a method for monitoring a heat exchanger unit that may include one or more steps of: coupling the heat exchanger unit in fluid communication with a heat generating device; associating a monitoring module with an airflow side of the heat exchanger unit; operating the heat exchanger unit and the heat generating device in a manner whereby an at least one service fluid is transferred therebetween; operating the heat exchanger unit to reduce a temperature of the at least one service fluid; operating the monitoring module whereby the microcontroller performs the data acquisition and data comparison tasks to resultantly generate an indication related to an amount of fouling on the airflow side; and performing a cleaning action on the heat exchanger unit.

The monitoring module may include a cover panel coupled to the heat exchanger unit; a plurality of sensors, one or more of which may have a respective rotating member with a plurality of blades extending therefrom; a logic circuit in operable communication with the plurality of sensors. The module may include a microcontroller operable with computer instructions for performing a set of tasks related to data acquisition and data comparison.

Still other embodiments of the disclosure pertain to a method for monitoring a heat exchanger unit that may include one or more steps of: operating a heat exchanger unit and a heat generating device in a manner whereby an at least one service fluid is transferred therebetween; associating a monitoring module with an airflow side of the heat exchanger unit; operating the heat exchanger unit to reduce a temperature of the at least one service fluid; and optionally based on an indication, performing an action on the heat exchanger unit.

The monitoring module may include a plurality of sensors, at least one of which has a respective rotating member with a plurality of blades extending therefrom; a logic circuit in operable communication with the plurality of sensors. The module may include a microcontroller operable with computer instructions for performing the tasks of: (i) acquiring a set of data from at least one of the plurality of sensors; (ii) sampling the set of data over a predetermined period of time; (iii) determining whether the set of data is acceptable within a defined parameter; (iv) determining whether a first lookup table comprising a set of lookup data has been completed; (v) establishing the first lookup table; (vi) comparing the set of data to the set of lookup data; and (vii) providing an indication based on a result of the comparing the set of data to the set of lookup data step.

In aspects, the method may further include initiating operation of the monitoring module whereby the microcontroller performs tasks (i)-(vii);

These and other embodiments, features and advantages will be apparent in the following detailed description and drawings.

BRIEF DESCRIPTION OF THE DRAWINGS

A full understanding of embodiments disclosed herein is obtained from the detailed description of the disclosure presented herein below, and the accompanying drawings, which are given by way of illustration only and are not intended to be limitative of the present embodiments, and wherein:

FIG. 1C shows a component breakout view of a controller housing usable with a monitoring module, and having various internal components according to embodiments of the disclosure;

FIG. 3 shows a side view of a monitored heat exchanger system that includes a monitoring module, a four-sided heat exchanger, and a heat generating device coupled together according to embodiments of the disclosure.

DETAILED DESCRIPTION

Figure 1A:
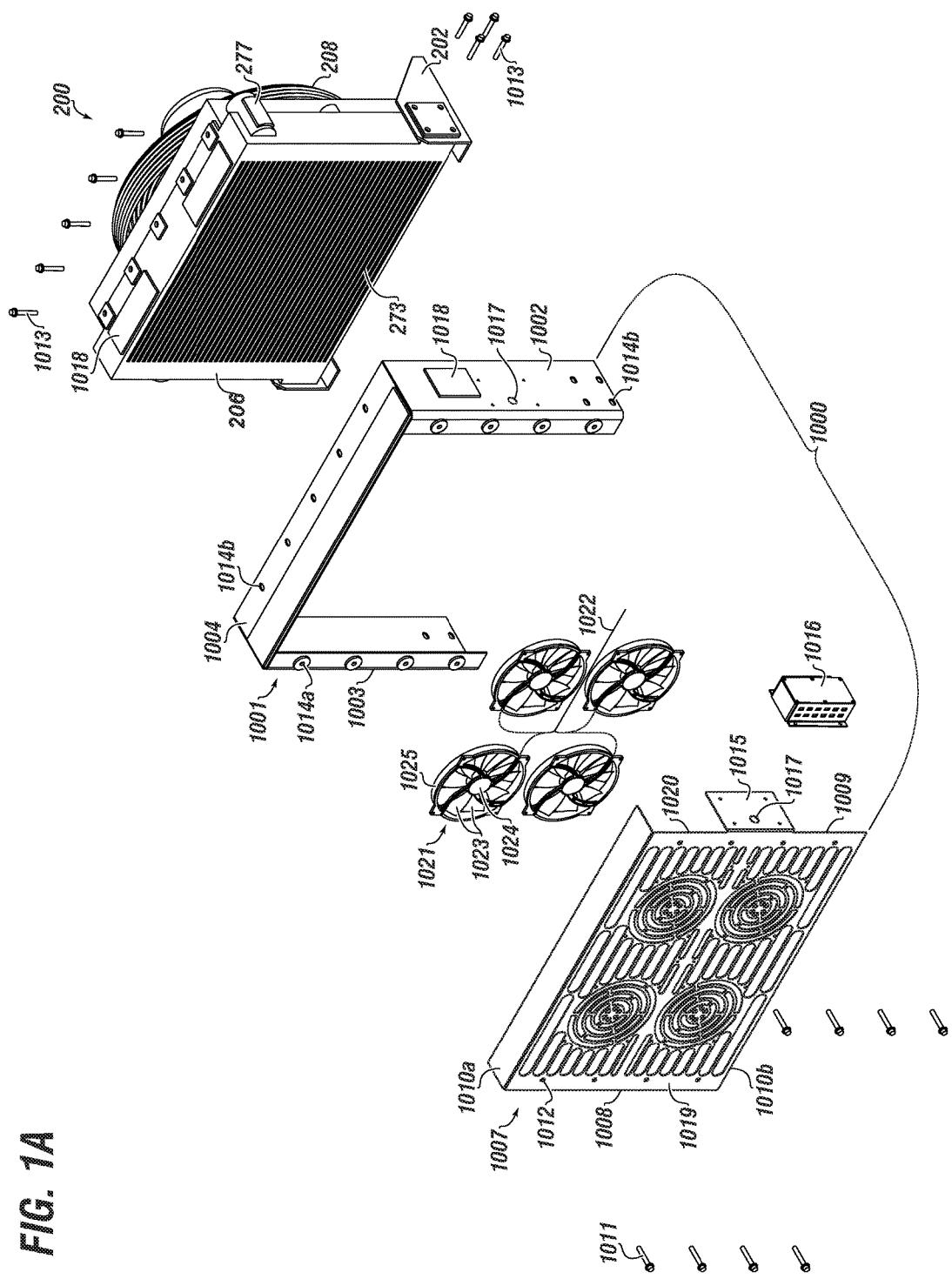
FIG. 1A shows an isometric view of a monitored heat exchanger system that includes a monitoring module, a heat exchanger unit, and a heat generation device operably coupled together according to embodiments of the disclosure.

Herein disclosed are novel apparatuses, systems, and methods that pertain to an improved heat exchanger, details of which are described herein.

Embodiments of the present disclosure are described in detail with reference to the accompanying Figures. In the following discussion and in the claims, the terms "including" and "comprising" are used in an open-ended fashion, such as to mean, for example, "including, but not limited to . . . ". While the disclosure may be described with reference to relevant apparatuses, systems, and methods, it should be understood that the disclosure is not limited to the specific embodiments shown or described. Rather, one skilled in the art will appreciate that a variety of configurations may be implemented in accordance with embodiments herein.

Although not necessary, like elements in the various figures may be denoted by like reference numerals for consistency and ease of understanding. Numerous specific details are set forth in order to provide a more thorough understanding of the disclosure; however, it will be apparent to one of ordinary skill in the art that the embodiments disclosed herein may be practiced without these specific details. In other instances, well-known features have not been described in detail to avoid unnecessarily complicating the description. Directional terms, such as "above," "below," "upper," "lower," "front," "back," "right", "left", "down", etc., are used for convenience and to refer to general direction and/or orientation, and are only intended for illustrative purposes only, and not to limit the disclosure.

Connection(s), couplings, or other forms of contact between parts, components, and so forth may include conventional items, such as lubricant, additional sealing materials, such as a gasket between flanges, PTFE between threads, and the like. The make and manufacture of any particular component, subcomponent, etc., may be as would be apparent to one of skill in the art, such as molding, forming, press extrusion, machining, or additive manufacturing. Embodiments of the disclosure provide for one or more components to be new, used, and/or retrofitted to existing machines and systems.

Terms

The term "engine" as used herein can refer to a machine with moving parts that converts power into motion, such as rotary motion. The engine can be powered by a source, such as internal combustion.

The term "motor" as used herein can be analogous to engine. The motor can be powered by a source, such as electricity, pneumatic, or hydraulic.

The term "drive" (or drive shaft) as used herein can refer to a mechanism that controls or imparts rotation of a motor(s) or engine(s).

The term "pump" as used herein can refer to a mechanical device suitable to use an action such as suction or pressure to raise or move liquids, compress gases, and so forth. 'Pump' can further refer to or include all necessary subcomponents operable together, such as impeller (or vanes, etc.), housing, drive shaft, bearings, etc. Although not always the case, 'pump' can further include reference to a driver, such as an engine and drive shaft. Types of pumps include gas powered, hydraulic, pneumatic, and electrical.

The term "frac pump" as used herein can refer to a pump that is usable with a frac operation, including being able to provide high pressure injection of a slurry into a wellbore. The frac pump can be operable in connection with a motor or engine. In some instances, and for brevity, 'frac pump' can refer to the combination of a pump and a driver together.

The term "frac truck" as used herein can refer to a truck (or truck and trailer) useable to transport various equipment related to a frac operation, such as a frac pump and engine, and a radiator.

The term "frac operation" as used herein can refer to fractionation of a downhole well that has already been drilled. 'Frac operation' can also be referred to and interchangeable with the terms fractionation, hydrofracturing, hydrofracking, fracking, fracing, and frac. A frac operation can be land or water based.

The term "radiator" can also be referred to or interchangeable with the term 'heat exchanger' or 'heat exchanger panel'. The radiator can be a heat exchanger used to transfer thermal energy from one medium to another for the purpose of cooling and/or heating.

The term "cooler" as used herein can refer to a radiator made up of tubes or other structure surrounded by fins (or 'core') that can be configured to extract heat from a fluid moved through the cooler. The term can be interchangeable with 'heat exchanger panel' or comparable. Heat can also be exchanged to another fluid, such as air.

The term "cooling circuit" as used herein can refer to a cooler and respective components.

The term "core" as used herein can refer to part of a cooler, and can include multiple layers of fins or fin elements.

The term "heat exchanger unit" as used herein can refer to a device or configuration that uses one or more coolers along with other components, such as a fan, mounts, tubing, frame, and so on. The heat exchanger unit can be independent and standalone or can be directly mounted to a heat generating device. The heat exchanger unit can be operable to pull (draw) ambient air in through the coolers in order to cool one or more service fluids. The heated air is moved or blown out as a waste exhaust stream.

The term "heat generating device" (or sometimes 'HGD') as used herein can refer to an operable device, machine, etc. that emits or otherwise generates heat during its operation, such as an engine, motor, a genset, or a frac pump (including the pump and/or respective engine). The HGD can be for an industrial or a residential setting.

The term "genset" (or generator set) as used herein can refer to a 'diesel generator' or the combination of a diesel engine (or comparable) and an electric generator. The genset can convert mechanical energy to electrical energy.

The term "utility fluid" as used herein can refer to a fluid used in connection with the operation of a heat generating device, such as a lubricant or water. The utility fluid can be for heating, cooling, lubricating, or other type of utility. 'Utility fluid' can also be referred to and interchangeable with 'service fluid' or comparable.

The term "mounted" as used herein can refer to a connection between a respective component (or subcomponent) and another component (or another subcomponent), which can be fixed, movable, direct, indirect, and analogous to engaged, coupled, disposed, etc., and can be by screw, nut/bolt, weld, and so forth.

The term "sensor" as used herein can refer to a device that detects or measures a physical property and may record, indicate, or otherwise respond to it. The output of a sensor can be an analog or digital signal.

The term "airflow sensor" as used herein can refer to a sensor used to detect or otherwise be able to measure (directly or indirectly) airflow.

The term "microprocessor" as used herein can refer to a logic chip or a computer processor on a microchip. The microprocessor may have most or all central processing unit (CPU) functions.

The term "microcontroller" as used herein can refer to a CPU with additional function or structure, such as RAM, ROM, and or peripherals like I/O all embedded on a single chip.

The term "voltage regulator" as used herein can refer to a device or logic circuit that maintains a constant voltage level.

The term "computer readable medium" (CRM) as used herein can refer to any type of medium that can store programming for use by or in connection with an instruction execution system, apparatus, or device. The CRM may be, for example, a device, apparatus, or system based on electronic, magnetic, optical, electromagnetic, or semiconductor function. By way of further example, the CRM may include an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical).

The term "solid data storage" as used herein can refer to a CRM having an array of data, including one or more lookup tables (LUT).

The term "lookup table" (or LUT) as used herein can refer to a data array that may include predetermined or reference data useable for comparison. A LUT(s) can be stored in static program storage, including solid data storage.

The term "Wi-Fi module" as used herein can refer to a device or logic circuit that provides ability for a microcontroller to communicate data to a network, as well as update firmware and code inside the microcontroller.

The term "GSM module" as used herein can refer to a device or logic circuit that provides ability for a microcontroller to communicate data or signal to a Global System for Mobile communication (GSM). The microcontroller can thus initiate, for example, the sending of information in a SMS message.

The term "CAN-Bus module" as used herein can refer to a message-based protocol that allows a microcontroller to communicate with other devices, which can include industrial or large pieces of equipment associated with a respective microcontroller.

Embodiments herein pertain to a monitored heat exchanger system that may include a heat exchanger unit in operable engagement with a heat generating device, with an at least one service fluid being transferable therebetween. The HX unit may include a frame; and at least one cooler coupled with the frame, the at least one cooler having an airflow-in side and a service fluid-in side.

The system may include a monitoring module coupled to the heat exchanger unit. The monitoring module may include a panel (or cover panel); an at least one sensor coupled with the cover panel; an at least one controller housing coupled with the cover panel; and a microcontroller disposed within the controller housing and in operable communication with the at least one sensor.

The at least one sensor may include a rotating member configured to generate a system signal proportional to an amount of rotation of the rotating member. In aspects, the microcontroller may be provided with computer instructions, and may be otherwise operable, for processing the system signal.

The monitoring module may include a plurality of sensors. One or more of the plurality of sensors may be in operable communication with the microcontroller. In aspects, at least one of the plurality of sensors or the microcontroller may be powered at least partially, directly or indirectly, by rotation of the rotating member.

The at least one sensor may include a plurality of blades extending (such as generally radially) from the rotating member. The system signal may pertain to or be based on an amount of fouling associated with the airflow side of the at least one cooler.

The monitoring module may include one or more of a solid data storage, a Wi-Fi module, a GSM module, and a CAN-Bus module. Each may be disposed within the controller housing and may be in operable communication with the microcontroller. Accordingly, the microcontroller may be provided with computer instructions for communicating with one or more of the solid data storage, the Wi-Fi module, the GSM module, and the CAN-Bus module.

The at least one service fluid comprises one of lube oil, hydraulic fluid, fuel, charge air, transmission fluid, jacket water, and engine cooler. The heat generation device may be a diesel engine. In aspects, the heat exchanger unit may have four respective sides (and thus cubical or rectangular prism shaped). Each side may have a respective cooler mounted to the frame.

The heat exchanger unit may include a vertical axis; a frame comprising a top region, a bottom region, and a plurality of side regions; a plurality of coolers, each of the plurality of coolers coupled with the frame proximate to a respective side region of the plurality of side regions. Each of the plurality of coolers may have an outer surface and an inner surface. There may be an airflow region within the heat exchanger unit.

The heat exchanger unit may include a first set of baffles disposed therein. One or more of the first set of baffles may be configured or otherwise oriented at a first angle to the vertical axis.

The heat exchanger unit may include a second set of baffles disposed therein, each baffle of the second set of baffles configured at a second angle to the vertical axis. The heat exchanger unit may include a third set of baffles, each baffle of the third set of baffles configured at a third angle to the vertical axis. In aspects, the heat exchanger unit may include a fourth set of panels.

The first set of baffles, the second set of baffles, and the third set of baffles may have about three to about five baffles. One or more baffle of the first set of baffles, the second set of baffles, and/or the third set of baffles may include a sound absorbing material.

One or more baffles may be generally isosceles trapezoidal in shape. On or more baffles may have mineral wool disposed therein. One or more baffles may be configured (positioned, mounted, oriented, etc.) at a respective angle in the range of about 30 to about 60 degrees.

The heat exchanger unit may include a fan mount bar; a shroud coupled to a top surface; an aeroring; and a fan mounted to the fan mount bar. The fan may have a motor and a one or more fan blades, including in the range of about 8 to about 12. The heat exchanger unit may have an exhaust outlet.

The heat exchanger unit may have a plurality of coolers configured to permit airflow to pass therethrough. In aspects, operation of a fan may result in airflow through each of the plurality of coolers, into the airflow region, and out of the outlet. The frame of the heat exchanger unit may include a plurality of horizontal members and vertical member configured together in a manner that results in a generally cube-shaped frame.

The heat exchanger unit of the system may include other configurations, such as a frame comprising a top region, a bottom region, and plurality of side regions; a plurality of coolers, each of the plurality of coolers coupled with the frame proximate to a respective side region, and each of the plurality of coolers comprising a core welded with a tank. Each core further may include a core end having a core end mass. Each tank further may include a tank end having a tank end mass. In aspects, each core end mass may be greater than each respective tank end mass.

The heat exchanger system may include the HX unit having a frame with a top region, a bottom region, and an at least one side region. There may be at least one cooler coupled with the frame proximate to the at least one side region. The cooler may have an outer surface and an inner surface.

The system may include the use of a mount assembly for coupling a cooler to the frame of the HX unit. The mount assembly may include an elongated fastening member; a rigid outer ring; a rigid inner ring; and a deformable ring disposed between the rigid outer ring and the inner outer ring, At least one cooler may include a mounting slot. In aspects, the elongated fastening member may extend through the rigid inner ring and at least partially into the frame.

Other embodiments of the disclosure pertain to a monitored heat exchanger system that may include a heat exchanger unit in operable engagement (including fluid communication) with a heat generating device. There may be an at least one service fluid transferable therebetween. The heat exchanger unit may include a frame; and at least one cooler coupled with the frame, the at least one cooler having an airflow side and a service fluid side fluidly separated from each other.

The monitored system may include a monitoring module coupled to the heat exchanger unit. The monitoring module may include a cover panel; an at least one sensor coupled with the cover panel; at least one controller housing proximate with the cover panel; and a microcontroller mountingly disposed within the controller housing and in operable communication with the at least one sensor.

The at least one sensor may include a rotating member configured to generate a system signal proportional to an amount of rotation of the rotating member. The microcontroller may be provided with computer instructions for processing the system signal. In aspects, an amount of rotation of the rotating member maybe dependent upon an amount of fouling in the airflow side.

The monitoring module may include a plurality of sensors. One or more of the plurality of sensors may be in operable communication with the microcontroller. In aspects, at least one of the plurality of sensors or the microcontroller may be powered at least partially, directly or indirectly, by rotation of the rotating member.

The monitoring module may include one or more of a solid data storage, a Wi-Fi module, a GSM module, and a CAN-Bus module. Any of which may be mountingly disposed within the controller housing and may be in operable communication with the microcontroller. Accordingly, the microcontroller may be provided with computer instructions for communicating and otherwise operating with one or more of the solid data storage, the Wi-Fi module, the GSM module, and the CAN-Bus module.

The at least one service fluid may be one of lube oil, hydraulic fluid, fuel, charge air, transmission fluid, jacket water, and engine cooler. The heat generation device may be a diesel engine. The heat exchanger unit may have a plurality of sides, such as about three sides to about five sides. In aspects, there may be four sides. Any of the sides may have a respective cooler mounted to the frame proximate thereto. Any of the sides may have a respective monitoring module operably associated therewith.

The heat exchanger unit of the monitored system may include a frame having a top region, a bottom region, and plurality of side regions; a plurality of coolers, each of the plurality of coolers coupled with the frame proximate to a respective side region, and each of the plurality of coolers comprising a core welded with a tank; and a first set of baffles, each baffle of the first set of baffles configured at a first angle to an axis.

In aspects, one or more cores may have a core end having a core end mass. In aspects, one or more tanks may have a tank end having a tank end mass. In aspects, the core end mass may be greater than the tank end mass of a respective core.

The heat exchanger unit may include a second set of baffles, each baffle of the second set of baffles configured at a second angle to the axis. Any of the baffles may have a sound absorbing material therein. The first angle and/or the second angle may be in the range of about 30 degrees to about 60 degrees. The sound absorbing material may be mineral wool.

The heat exchanger unit of the system may include a frame comprising a top region, a bottom region, and one or more side regions. There may be one or more coolers coupled with the frame proximate to a respective side region. Any cooler may have a core welded with a tank. The unit may include a first set of baffles, any of which may be configured at a first angle to an axis. Any core may include a core end having a core end mass. Any tank may have a tank end having a tank end mass. For any respective core, the core end mass may be greater than each respective tank end mass.

The heat exchanger unit may include a mount assembly associated therewith. The mount assembly may be configured for coupling a respective cooler to the frame. The mount assembly may include an elongated fastening member; a rigid outer ring; a rigid inner ring; and a deformable ring disposed between the rigid outer ring and the inner outer ring. The respective cooler may include at least one mounting slot, whereby the elongated fastening member may extend through the rigid inner ring and at least partially into the frame.

The heat exchanger unit may include a vertical axis; an airflow region within the heat exchanger unit; and a first set of baffles, each of the first set of baffles configured at an angle to the vertical axis.

Any of the baffles may have a sound absorbing material, such as mineral well, disposed therein (or therewith). An orientation angle of the baffle within the heat exchanger unit may be in the range of about 30 to about 60 degrees.

The heat exchanger unit of the system may include a fan mount bar extending between one of the plurality of side regions and another of the plurality of side regions; and a fan mounted to the fan mount bar. The fan may include a motor and a plurality of fan blades in the range of about 8 to about 12. The fan may include a hydraulic motor. The motor may be powered by a pressurized hydraulic fluid pressurized to a range of about 2000 to about 6000 psi. The pressurized fluid may be cooled by the heat exchanger unit.

Any respective cooler may include a weld between the tank end and the core end that may be a v-groove weld.

The heat exchanger unit may include between about one set of baffles to about four sets of baffles, any of which may include the sound absorbing material, which may include mineral wool. Baffles of the sets may have various orientation angles, including in the range of about 30 degrees to about 60 degrees. Baffles of the sets may have various shapes, any of which may be generally isosceles trapezoidal in shape.

Embodiments of the disclosure pertain to a monitoring module for monitoring operation of a heat exchanger unit that may include a cover panel configured for direct or indirect coupling to the heat exchanger unit; one or more sensors coupled with the cover panel. Any of the one or more sensors may have a respective rotating member with a plurality of blades extending therefrom.

The module may include a logic circuit in operable communication with the plurality of sensors, and further comprising: a microcontroller and a data storage. The microcontroller may be configured with computer instructions for performing one or more of the tasks of: acquiring a set of data from at least one of the plurality of sensors; sampling the set of data over a predetermined period of time; computing an average and a standard deviation of the set of data; comparing the standard deviation with predetermined data; determining whether the set of data is acceptable within a defined parameter; determining whether a first lookup table comprising a set of lookup data has been completed, and creating the first lookup table using an averaging method if it has not; comparing the set of data to the set of lookup data; and providing an indication based on a result of the comparing the set of data to the set of lookup data step.

The microcontroller may be powered at least partially, directly or indirectly, by at least one of the plurality of sensors.

The indication may be communicated to an end user by way of at least one of: a text message, an email, an audio signal, a visual indicator, and combinations thereof.

The logic circuit may include the microcontroller in operable communication with one or more of: a Wi-Fi module, a GSM module, and a CAN-Bus module. Accordingly, the microcontroller may be provided with computer instructions for communicating with one or more of: the Wi-Fi module, the GSM module, and the CAN-Bus module.

Other embodiments of the disclosure pertain to a monitoring module that may include a cover panel mountingly associated with an airflow side of the heat exchanger unit; a plurality of sensors coupled with the cover panel, each of the sensors having a respective rotating member with a plurality of blades extending therefrom; a logic circuit in operable communication with the plurality of sensors. The logic circuit may include a microcontroller configured with computer instructions for performing one or more of the tasks of: acquiring a set of data from at least one of the plurality of sensors; sampling the set of data over a predetermined period of time of less than 120 seconds; computing an average and a standard deviation of the set of data; comparing the standard deviation with predetermined data stored in a data storage; determining whether the set of data is acceptable within a defined parameter; determining whether a first lookup table comprising a set of lookup data has been completed, and creating the first lookup table using an averaging method if it has not; comparing the set of data to the set of lookup data; and providing an indication based on a result of the comparing the set of data to the set of lookup data step.

The logic circuit may include the microcontroller in operable communication with one or more of a Wi-Fi module, a GSM module, and a CAN-Bus module. Thus the microcontroller may have computer instructions programmed therein for communicating with one or more of the Wi-Fi module, the GSM module, and the CAN-Bus module.

The monitoring module may be operable to provide the indication as it pertains to an amount of fouling on the airflow side.

The microcontroller may be powered at least partially by at least one of the plurality of sensors.

A method for monitoring a heat exchanger unit coupling the heat exchanger unit with a heat generating device; associating a monitoring module with an airflow side of the heat exchanger unit. The monitoring module may include a cover panel configured for direct or indirect coupling to the heat exchanger unit; an at least one sensor coupled with the cover panel, the at least one sensor having a respective rotating member with a plurality of blades extending therefrom.

The logic circuit may be in operable communication with the at least one sensor. The microcontroller may have computer instructions for performing one more of the tasks of: acquiring a set of data from the at least one sensor; sampling the set of data over a predetermined period of time; computing an average and a standard deviation; comparing the standard deviation with predetermined data stored on a data storage; determining whether the set of data is acceptable within a defined parameter; determining whether a first lookup table comprising a set of lookup data has been completed, and creating the first lookup table using an averaging method if it has not; comparing the set of data to the set of lookup data; providing an indication based on a result of the comparing the set of data to the set of lookup data step; and performing an action based on the indication.

In aspects, the microcontroller is powered at least partially by at the at least one sensor. The indication is communicated to an end user by way of at least one of: a text message, an email, an audio signal, display, a visual indicator, and combinations thereof. The indication may be related to an amount of fouling present within the airflow side.

The monitoring module may include a plurality of sensors, any of which may be in operable communication with the microcontroller.

The method may include where the monitoring module may have one or more of a solid data storage, a Wi-Fi module, a GSM module, and a CAN-Bus module being disposed within the controller housing, one or more of which may be in operable communication with the microcontroller. Thus the microcontroller may be programmed with respective computer instructions for communicating therewith, as applicable.

The method may include the use of at least one service fluid transferable between the heat exchanger unit and the heat generation device. The service fluid may be one of lube oil, hydraulic fluid, fuel, charge air, transmission fluid, jacket water, and engine cooler. There may be multiple service fluids transferable between the heat exchanger unit and the heat generation device.

In aspects, the generation device of the method may be a diesel engine. The heat exchanger unit may have four sides, each side having a respective cooler mounted to the frame.

The method may include the use of the heat exchanger unit having one or more of a vertical axis; a frame comprising a top region, a bottom region, and a plurality of side regions; a plurality of coolers, each of the plurality of coolers coupled with the frame proximate to a respective side region of the plurality of side regions, and each of the plurality of coolers having an outer surface and an inner surface; an airflow region within the heat exchanger unit; and a first set of baffles, each baffle of the first set of baffles configured at a first angle to the vertical axis.

The heat exchanger unit of the method may further have a second set of baffles, one or more of which may be configured at a second angle to the vertical axis. There may be a third set of baffles, one or more of which may be configured at a third angle to the vertical axis. There may be a fourth set of baffles. Any baffle of the fourth set of baffles may be configured at a fourth angle to the vertical axis. Any of the first, second, third, and fourth angles may be in the range of about 30 degrees to about 60 degrees. Any of the sets of baffles may have about four baffles. Any of the baffles may comprise a sound absorbing material associated therewith. Any of the baffles may be generally isosceles trapezoidal in shape The heat exchanger unit of the method may further include one or more of a fan mount bar; a shroud coupled to a top surface; an aeroring; and a fan mounted to the fan mount bar. The fan may include a motor and a plurality of fan blades in the range of about 8 to about 12. The unit may have an exhaust outlet.

The heat exchanger unit of the method may include one or more of a frame comprising a top region, a bottom region, and plurality of side regions; a plurality of coolers, each of the plurality of coolers coupled with the frame proximate to a respective side region, and each of the plurality of coolers comprising a core welded with a tank; and a first set of baffles, each baffle of the first set of baffles configured at a first angle to an axis Any cooler of the heat exchanger unit may have a core end mass. Any cooler of the heat exchanger unit may have a tank end mass. In aspects, the core end mass may be greater than the tank end mass of any of the respective coolers.

The method may include configuring the exchanger unit with a mount assembly. The mount assembly may include an elongated fastening member; a rigid outer ring; a rigid inner ring; a deformable ring disposed between the rigid outer ring and the inner outer ring. At least one of the plurality of coolers may include a mounting slot. In aspects, the elongated fastening member may extend through the rigid inner ring and at least partially into the frame.

The method may include the heat exchanger unit having an airflow region therein. The heat exchanger unit may include a fan mount bar extending between one of the plurality of side regions and another of the plurality of side regions. There may be a fan mounted to the fan mount bar, the fan further having a motor and a plurality of fan blades in the range of about 8 to about 12.

A respective cooler of the heat exchanger unit may have a weld between the first tank end and the core end that may be a v-groove weld.

Yet other embodiments of the disclosure pertain to a method for monitoring a heat exchanger unit that may include one or more steps of coupling the heat exchanger unit in fluid communication with a heat generating device; and associating a monitoring module with an airflow side of the heat exchanger unit The monitoring module may include one or more of a cover panel coupled to the heat exchanger unit; a plurality of sensors, each having a respective rotating member with a plurality of blades extending therefrom; and a logic circuit in operable communication with the plurality of sensors. The logic circuit may include a microcontroller that may be programmable and programmed for performing various tasks that may include any of: acquiring a set of data from at least one of the plurality of sensors; sampling the set of data over a predetermined period of time; determining whether the set of data is acceptable within a defined parameter; determining whether a first lookup table comprising a set of lookup data has been completed; comparing the set of data to the set of lookup data; providing an indication based on a result of the comparing the set of data to the set of lookup data step; based on the indication, performing a cleaning action on the heat exchanger unit.

The monitoring module may include one or more of a solid data storage, a Wi-Fi module, a GSM module, and a CAN-Bus module being disposed within the controller housing and in operable communication with the microcontroller. Accordingly the microcontroller may be provided with computer instructions for communicating with one or more of the solid data storage, the Wi-Fi module, the GSM module, and the CAN-Bus module.

The method may include an at least one service fluid transferable between the heat exchanger unit and the heat generation device. The service fluid may be one of lube oil, hydraulic fluid, fuel, charge air, transmission fluid, jacket water, and engine cooler.

In aspects, the heat generation device may be a diesel engine. The heat exchanger unit may include four sides, each side having a respective cooler mounted to the frame.

The heat exchanger unit of the method may include a vertical axis; a frame comprising a top region, a bottom region, and a plurality of side regions; a plurality of coolers, each of the plurality of coolers coupled with the frame proximate to a respective side region of the plurality of side regions, and each of the plurality of coolers having an outer surface and an inner surface; an airflow region within the heat exchanger unit; and a first set of baffles, each baffle of the first set of baffles configured at a first angle to the vertical axis.

The heat exchanger unit may further include a second set of baffles, each baffle of the second set of baffles configured at a second angle to the vertical axis. There may be a third set of baffles, each baffle of the third set of baffles configured at a third angle to the vertical axis. Any of the sets of baffles may have between about 1 to about 8 baffles. In aspects, any of the sets of baffles may have about four baffles. Any of the baffles may include a sound absorbing material.

The heat exchanger unit may include any of a fan mount bar; a shroud coupled to a top surface; an aeroring; and a fan mounted to the fan mount bar. The fan may have a motor and a plurality of fan blades in the range of about 8 to about 12. There may be an exhaust outlet.

Embodiments of the disclosure pertain to a business method (or a method of doing business) that may include one or more steps of: entering into a transaction with a first recipient; per terms of the transaction, providing a monitoring module for a heat exchanger unit; operably associating the monitoring module with the heat exchanger unit, the monitoring module being operable to monitor a fouling condition of the heat exchanger unit; receiving an indication from the monitoring module related to the fouling condition; and performing a cleaning action of the heat exchanger unit upon based on the indication.

In aspects, the transaction may have one or more terms related to equipment purchase, installation, software license, data sharing, cleaning service, and combinations thereof.

The business method may pertain to use of the monitoring module having a plurality of sensors mounted proximate to an airflow side of the heat exchanger unit, one or more of the sensors having a respective rotating member with a plurality of blades extending therefrom. There may be a logic circuit in operable communication with the plurality of sensors. The logic circuit may include a microcontroller and a data storage. The microcontroller may be configured with computer instructions for performing one or more tasks of: acquiring a set of data from at least one of the plurality of sensors; sampling the set of data over a predetermined period of time, and computing an average and a standard deviation; comparing the standard deviation with predetermined data; determining whether the set of data is acceptable within a defined parameter; determining whether a first lookup table comprising a set of lookup data has been completed, and creating the first lookup table using an averaging method if it has not; comparing the set of data to the set of lookup data; and providing the indication based on a result of the comparing the set of data to the set of lookup data step.

In aspects, the transaction may pertain to a one-time or ongoing fee associated with the use and operation of the monitoring module. The method may include providing data acquired by the monitoring module to the first recipient. The method may include providing an incentive to the recipient when the transaction pertains to at least two of: equipment purchase, installation, software license, data sharing, and cleaning service.

The method may include, per terms of the transaction, performing at least one of: coupling the heat exchanger unit in fluid communication with a heat generating device, and associating the monitoring module with an airflow side of the heat exchanger unit.

The monitoring module of the method may have one or more of a solid data storage, a Wi-Fi module, a GSM module, and a CAN-Bus module being disposed within the controller housing and in operable communication with the microcontroller. The microcontroller may be provided with computer instructions for communicating with one or more of the solid data storage, the Wi-Fi module, the GSM module, and the CAN-Bus module.

There may be an least one service fluid if transferable between the heat exchanger unit and a heat generation device coupled in fluid communication therewith, and wherein the at least one service fluid comprises one of lube oil, hydraulic fluid, fuel, charge air, transmission fluid, jacket water, and engine cooler.

In aspects, the heat generation device may be a diesel engine. The heat exchanger unit may include four sides. One or more sides may have a respective cooler mounted to the frame.

The heat exchanger unit of the method may include a vertical axis; a frame comprising a top region, a bottom region, and a plurality of side regions; a plurality of coolers, each of the plurality of coolers coupled with the frame proximate to a respective side region of the plurality of side regions, and each of the plurality of coolers having an outer surface and an inner surface; an airflow region within the heat exchanger unit; and a first set of baffles, each baffle of the first set of baffles configured at a first angle to the vertical axis.

The heat exchanger unit may further include a second set of baffles, each baffle of the second set of baffles configured at a second angle to the vertical axis; and a third set of baffles, each baffle of the third set of baffles configured at a third angle to the vertical axis. The first set of baffles, the second set of baffles, and the third set of baffles may each have about four baffles. Any of the baffles may include a sound absorbing material, such as mineral wool.

The heat exchanger unit of the method may include a fan mount bar; a shroud coupled to a top surface; an aeroring; and a fan mounted to the fan mount bar. The fan may have a motor and a plurality of fan blades in the range of about 8 to about 12, and an exhaust outlet.

The heat exchanger unit may have at least one cooler having a core welded with a tank. The more may have a core end mass. The tank may have a tank end mass. In aspects, the core end mass may be greater than the tank end mass, of any respective core.

The heat exchanger unit may include the use of one or more mount assemblies. The mount assembly may be configured for coupling at least one cooler to the frame. The mount assembly may include: an elongated fastening member; a rigid outer ring; a rigid inner ring; a deformable ring disposed between the rigid outer ring and the inner outer ring. There may be at least one cooler having a mounting slot. The elongated fastening member may extend through the rigid inner ring and at least partially into the frame.

Figure 1B:
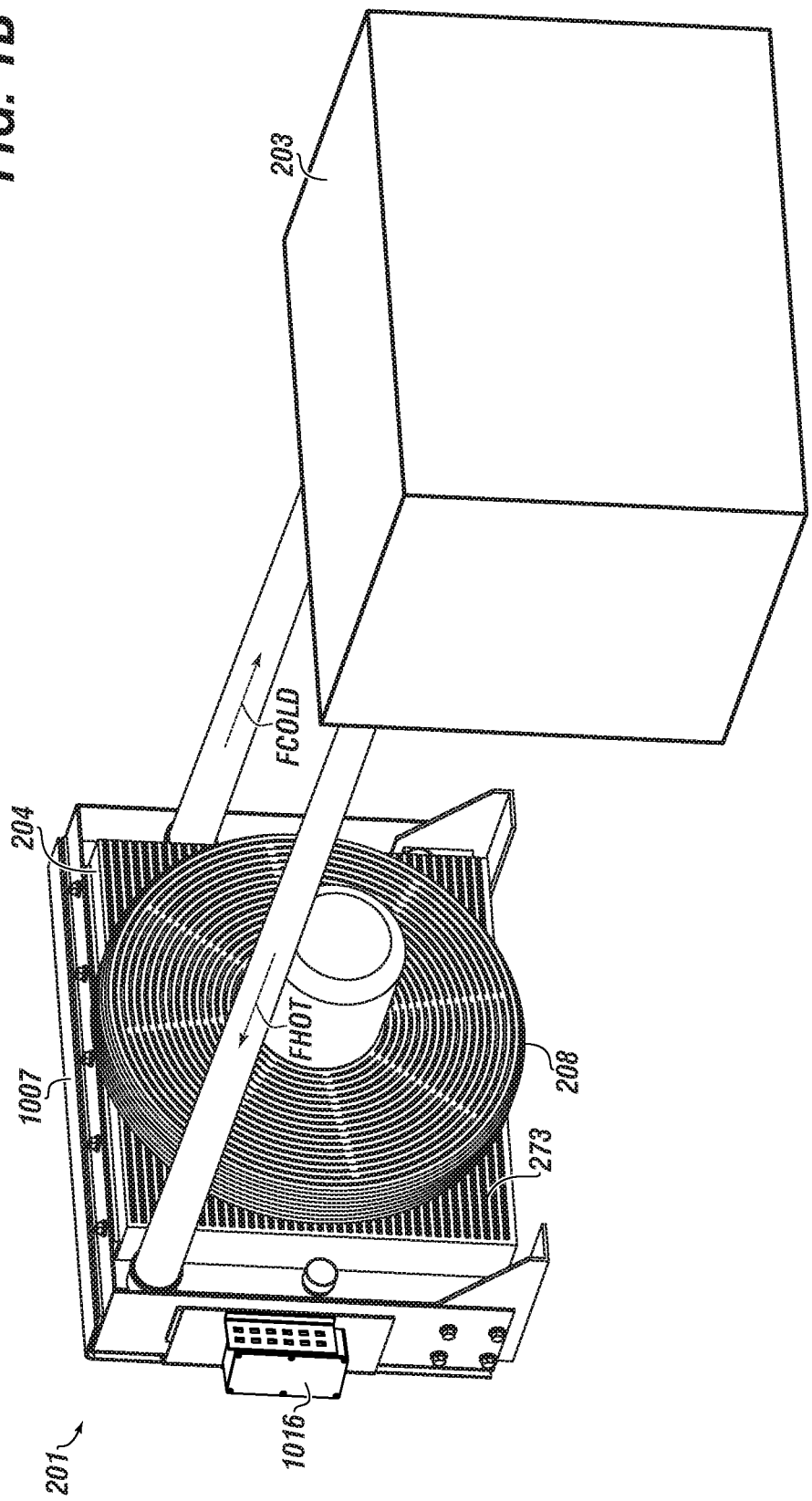
FIG. 1B shows an isometric view of a frame of the heat exchanger unit according to embodiments of the disclosure.

Referring now to FIGS. 1A and 1B together, an isometric view of a monitored heat exchanger system that includes a monitoring module, a heat exchanger unit, and a heat generation device operably coupled together, and an isometric component breakout of a monitoring module associated with a heat exchanger unit, respectively, in accordance with embodiments disclosed herein, are shown. Embodiments herein apply to a heat exchanger unit that may be an inclusive assembly of a number of components, subcomponents, which may be further associated with operable systems, subsystems, assemblies, modules, and so forth that may overall be referred to as a system, such as heat exchanger monitoring system 201 (or monitored heat exchanger system).

The heat exchanger unit (or HX unit) 200 may include a solid integral frame (or skeletal frame) or may be a frame 202 that includes a number of elements arranged and coupled together. The simplified diagram of FIG. 2B illustrates the HX unit 200 coupled with a heat generation device 203. As can be seen a hot service fluid $F_{hot}$ may circulate from the HGD 203 to the HX unit, be cooled via core 206 (also sometimes recognizes as a cooler or radiator, or part thereof), and recirculate as a cooled service fluid $F_{cool}$ back to the HGD 203. Other equipment including other piping, valves, nozzles, pumps, tanks, etc. need not be shown, as one of skill in the art would have an understanding of coupling the HX unit 200 with the HGD 203 for operable transfer of one or more service fluids therefrom.

As shown system 201 may include the use of a monitoring module 1000. The monitoring module 1000 may be usable for monitoring one or more conditions, properties, characteristics, etc. associated with the operation of the HX unit 200. As an example, the monitoring module 1000 may be configured and used for measuring fouling associated with the core 206.

The module 1000 may be a modular assembly having various components and subcomponents associated and operable together, and like that described herein. The module 1000 may be sized and optimized accordingly for operable coupling with any type of radiator, including that associated with the HX unit 200. One of skill in the art would appreciate the monitoring module 1000 could be retrofitted to equipment already used in the field. Just the same the monitoring module 1000 could come associated and operably engaged with newly fabricated equipment. In aspects, a single HX unit 200 may have multiple monitoring modules 1000 associated therewith.

The module 1000 may be coupled to the frame 202 on a respective side of the HX unit 200 (including in place of a rock grate [not shown]). As shown, the module 1000 may include a mounting frame 1001. The mounting frame 1001 may be an integral piece having a first mounting frame side 1002, a second mounting frame side 1003, a mounting frame top 1004, and a mounting frame bottom (not shown here). The mounting frame may have a cover panel or guard 1007, which may be integral or coupled therewith. Analogous to the mounting frame 1001, the cover panel 1007 may have a first cover panel side 1008, a second cover panel side 1009, a cover panel top 1010a, and a cover panel bottom 1010b. Although quadrilateral in the general sense, it is within the scope of the disclosure that the mounting frame 1001 and/or the cover panel 1007 may have different shapes, including as might be necessary to be mounted with a different shape HX unit or radiator core.

As shown in FIG. 1A, the cover panel 1007 may have a plurality of cover panel apertures 1012 configured to coincide with a respective plurality of mounting frame apertures 1014a. Likewise the mounting frame 1001 may have a plurality of other mounting frame apertures 1014b configured to coincide with a respective plurality of apertures 282 of the frame 202.

One of skill would appreciate the mounting frame 1001 may be connected to the frame 202 via insertion of a plurality of connectors (fasteners, etc.) 1013 through apertures 1014b and 282, which may be screws, nut/bolt, quick disconnect, etc. Similarly, the cover panel may be connected to the mounting frame 1001 via insertion of a plurality of cover connecters 1011 through apertures 1012 and 1014*a*. The use of a separable mounting frame 1001 and cover panel 1007 allows for simple connect and disconnect from each other, which may make it easier for tasks such as maintenance or cleaning. In this respect the panel 1007 may be easily attachable and removable from the HX unit 200.

There may be a dampener(s) 1018 disposed between various components. For example, there may be one or more dampeners 1018 disposed between the frame 202 and the mounting frame 1001. Analogously, there may be one or more dampeners 1018 disposed between the cover panel 1007 and the mounting frame 1001. The dampener(s) 1018 may be suitable for reducing vibration stemming from operation of the heat exchanger unit 200 that may otherwise be induced into or received by the monitoring module 1000. The dampener 1018 may be one or more layers of a rubbery material, which may have one or more sides with an adhesive thereon.

The cover panel 1007 may have a front side 1019 and a back side 1020. From a reference standpoint the front side 1019 may be that which tends to face outward or away from the HX unit 200. Or where the cover panel 1007 may be considered exposed or external to the surrounding environment. The back side 1020 of the cover panel 1007 may be associated with one or more sensors 1021. The monitoring module 1000 may have a number of different types of sensors associated therewith, including pressure, temperature, noise, etc. Sensor 1021 may be referred to as an airflow sensor, in that the operation of sensor 1021 may help measure, determine, or otherwise sense airflow 216 moving into (or out of) the HX unit 200. In aspects, there may be about 1 to about 25 sensors 1021 associated with module 1000. However, the number of sensors 1021 is not meant to be limited, and may change depending on desired monitoring requirements for a given type of heat exchanger.

The sensor 1021 may be mounted to the cover panel 1007, and operated in a manner to sense airflow into the HX unit 200 as a result of suction. However, the sensor 1021 may just as well be mounted and operated in a manner to sense airflow out of the HX unit 200 (as a result of blowing). The sensor 2021 may be operated and setup to detect airflow through the core 206 during a clean, unfouled state, which may then be used as a baseline. As the HX unit 200 fouls, airflow through the core 206 may be effected, and the electrical signal generated by the sensor 1021 will have a measurable, detectable change in signal strength.

In some embodiments, the configuration (including its size, type placement, etc.) and operation of the sensor 1021 is believed of significance. For example, the sensor 1021 may need to be robust and durable, yet not of any (or as minimal as possible) effect on the operation of the HX unit 200. For example, a sensor that has an orifice may be just as prone to fouling and plugging, and ultimately failure and inability to measure airflow. Other sensors that are large or bulky may be cost prohibitive and/or attribute to unacceptable pressure drop attributable to the monitoring module.

As shown the sensor 1021 may have a rotating member 1024 (rotatable around an axis) with a plurality of blade members 1023 extending radially therefrom. The blade members 1023 may be configured to induce movement of the rotating member 1024 (rotatable about an axis) much in the same way the blades of a windmill function. That is, upon movement of air thereby, at least a minor amount of force (the amount of force being dependent upon the amount of movement of air) will be felt by the blade members 1023, and as a result of being connected to the rotating member 1024, induce rotation of the member 1024.

The rotating member 1024 may be associated with one or more bearings, whereby the rotating member 1024 may be freely movable with respect to a sensor housing or chassis 1025. In aspects, the rotating member 1022 may have a shaft or rotor, and the housing 1025 may be configurable as a (pseudo) stator. The sensor 1021 may have various circuitry and hardware associated therewith, whereby rotation of the shaft may induce or generate an electric current (e.g., via inductive properties attributable to a rotor/stator configuration).

The sensor 1021 may thus be configured to generate an electric current (or in the analogous sense, a voltage) proportional to an amount of rotation. The current, or really, a signal, may then be communicated to a microcontroller (1006, FIG. 1C), which may be part of a logic circuit of the monitoring module 1000. To be sure, sensor 1021 in other embodiments may be able to communicate other forms of sensed information, such as, for example, rpm related to the rotating member.

Referring briefly to FIG. 1C, a component breakout view of a controller housing usable with a monitoring module, and having various internal components, according to embodiments of the disclosure, is shown. Equipment, such as hardware and software, pertaining to the logic circuit may be operably arranged within a controller housing 1016 (which may have a controller housing top 1016*a*).

The controller housing 1016 may be weatherproof and dustproof, and this may have an ability to protect internals from undesired environmental and harsh weather conditions. The housing 1016 may be mountable to housing mount 1015. The housing 1016 and housing mount 1015 may have corresponding openings 1017*a*, 1017*b*, respectively, for accommodating the passing of wires and other circuitry therethrough. The openings 1017*a,b* may be sealed, such as with silicone.

The controller housing 1016 may be configured with suitable components and hardware for that accommodate or provide functionality of the monitoring system 201. Such components may include, for example, the microcontroller 1006 (in operable communication and connected with sensors 1021 via wiring, circuitry, and so forth), a regulator (such as a voltage regulator) (not shown here), a power supply or battery (or battery cell) 1027*a*, a charger (e.g., battery charger) (not shown here), solid data storage 1028, a Wi-Fi module 1029, a GSM module 1030, a CAN-Bus module 1031, and various indicators, such as audio or visual (e.g., RGB LEDs) 1032.

Referring now to FIGS. 1A, 1B, and 1C, together, the microcontroller 1006 may be readily useable and compatible with various hardware, including switches, LED's, and sensors. The microcontroller 1006 may include HDMI output to a screen such as a TV or a monitor, as well as wirelessly communicating to smart phones or computers via Wifi or Bluetooth.

A signal from the microcontroller 1006 may generate a signal communicable as a message or other form of warning, including by way of one or more of audio, video/visual (e.g., Green, Yellow, Red LEDs), email, SMS/text, CAN Bus, such as J1939. Thus, the module 1000 may include a LED response interface. In embodiments, LED lights may be configured to provide varied warnings based on monitoring and detection. For example, and with respect to certain percentage of fouling, the LED lights may flash green (0-25% fouled), yellow (25-75% fouled), or red (75-100% fouled). In a similar manner, a warning may be transmitted (e.g., text/SMS, push notification, email, J1939, etc.) based on a percentage of fouling.

Software herein may be able to read values from the SD card and create a look-up table.

Figure 2A:
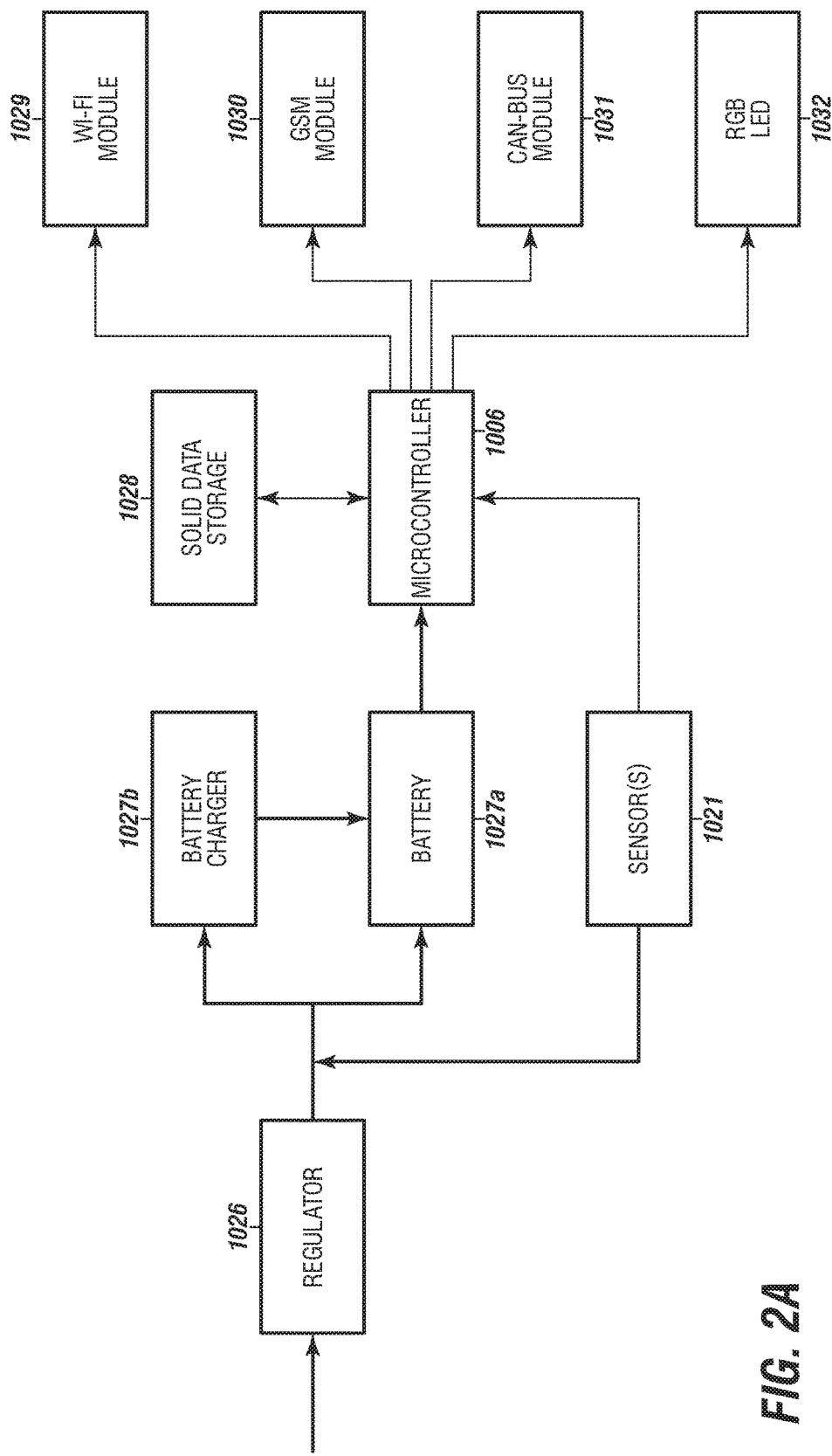
FIG. 2A shows a logic circuit process flow diagram according to embodiments of the disclosure.
Figure 2B:
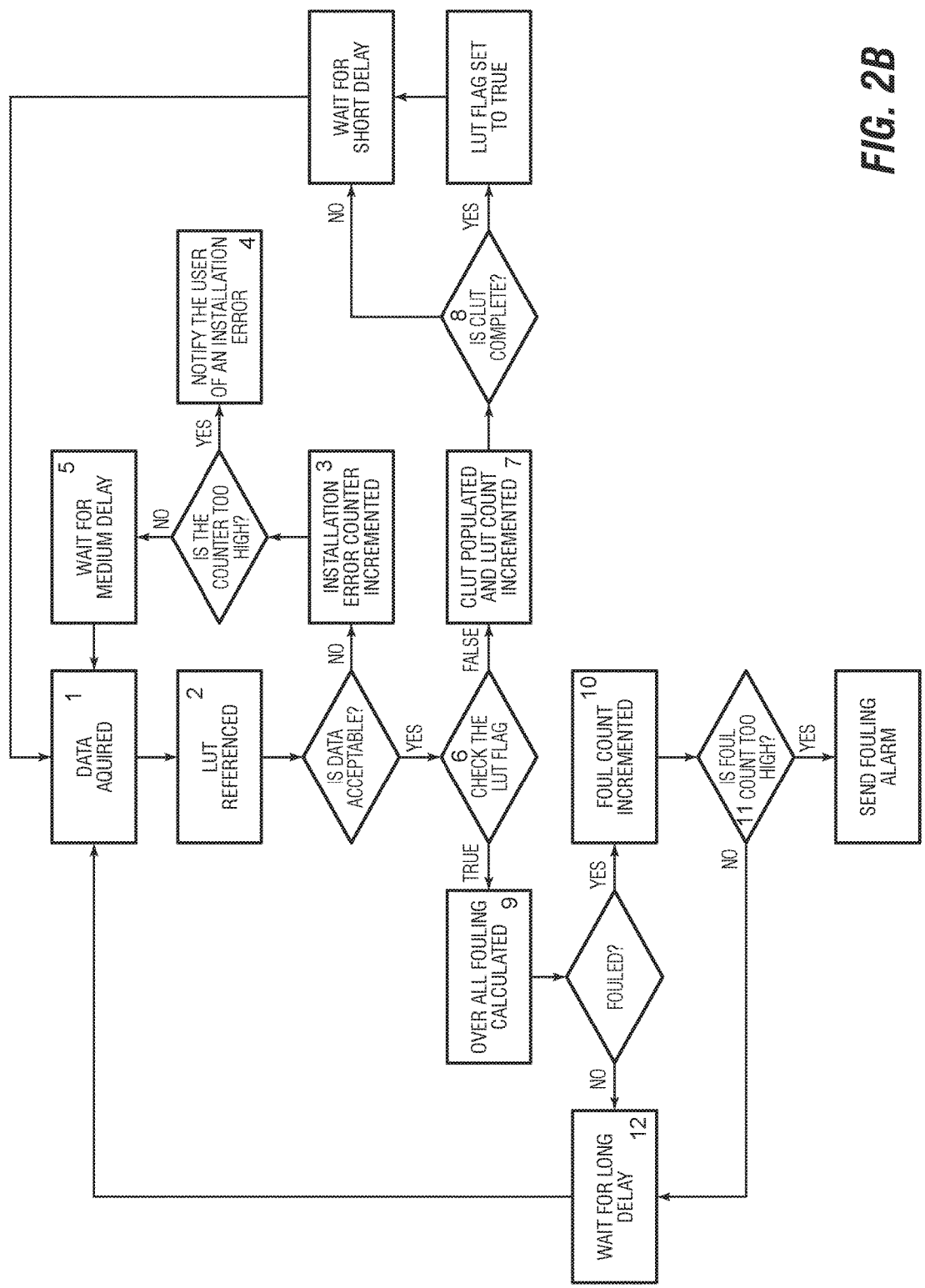
FIG. 2B shows a logic circuit decision tree operable as part of a monitoring module according to embodiments of the disclosure.

Referring now to FIGS. 2A and 2B together, a logic circuit process flow diagram and a logic circuit decision tree operable as part of a monitoring module, respectively, according to the embodiments of the disclosure, are shown. As illustrated and previously touched on, the monitoring module 1000 may include various hardware and software operable together as an overall 'logic circuit' in which logic of the present disclosure may be implemented.

The logic circuit may be programmable and compatible to various computer devices that include, for example, PCs, workstations, laptops, mobile devices, cell phones, tablets, PDAs, palm devices, servers, storages, and the like. Generally, in terms of hardware and related architecture, the logic circuit may include one or more microcontrollers 1006, memory or data storage 1028, and one or more I/O devices (not shown), which may all be operatively communicatively coupled together, including such as circuitry, pins, and via a local interface (not shown).

As would be apparent to one of skill in the art the local interface may be understood to include, for example, one or more buses or other wired or wireless connections. The local interface may have additional elements, such as controllers, buffers (caches), drivers, repeaters, and receivers, to enable communications. Further, the local interface may include address, control, and/or data connections to enable appropriate communications among the aforementioned components.

The logic circuit may receive power from a source, such as (upwards of) a 5V supplier. The power, which may be in the form of a voltage, may be regulated by regulator 1026. An example voltage regulator includes AC DC Converters_ Recom Power RAC03-05SE/277 (85~305 VAC TO V). Power from the regulator 1026 may be fed to a power supply or battery 1027a. The battery 1027a may be a LiPo battery cell (1200 mAh, 3.7V). The battery 1027a may be charged by a battery charger 1027b. An example battery charger includes LiPo Energy Shield.

The microcontroller (or sometimes just 'controller') 1006 may be a hardware device configured for execution of software (programming, computer readable instructions, etc.), which may be stored (programmed thereinto) in a controller memory. The controller 1006 may be any custom made or commercially available processor, a central processing unit (CPU), a digital signal processor (DSP), or an auxiliary processor among several processors associated therewith. As an example, the controller 1006 may be an Arduino MEGA 2560 microcontroller.

Microcontroller 1006 may be powered via the battery 1027a. In an embodiment, the microcontroller 1006 may be powered, directly or indirectly, via operation of the sensor(s) 1021. With power initiation, such as at startup of the monitoring module (1000), the controller 1006 may be in communicative operability with the SD storage 1028. An example SD storage includes Yun Shield.

The microcontroller 1006 may be in communicative operability with Wi-Fi module 1029. An example Wi-Fi module includes ESP8266 or particle photon.

The microcontroller 1006 may be in communicative operability with GSM module 1030. An example GSM module includes Arduino GSM Shield V2 or Particle Electron.

The microcontroller 1006 may be in communicative operability with CAN-Bus module 1031. An example CAN-Bus module includes CAN-BUS shield with MCP2515 CAN bus controller.

The microcontroller 1006 may be in communicative operability with LEDs 1032

The controller memory may include any one or combination of random access memory (RAM), dynamic random access memory (DRAM), static random access memory (SRAM), ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, and so forth. Moreover, the controller memory may incorporate electronic, magnetic, optical, and/or other types of storage media.

Software in the controller memory may include one or more separate programs, each of which may include an ordered listing of executable instructions for implementing logical functions. Software in the controller memory may include a suitable operating system (OS), compiler, source code, and/or one or more applications in accordance with embodiments herein. Software may be an application ("app") that may include numerous functional components for implementing the features and operations of embodiments of the disclosure.

The OS may be configured for execution control of other computer programs, and provides scheduling, input-output, file and data management, memory management, and communication control and related services. In aspects, the app may be suitable for implementation of embodiments herein to all commercially available operating systems.

Software may include an executable program, script, object code, source program, or any other comparable set of instructions to be performed.

Software may be written as object oriented programming language, which may have classes of data and methods, or a procedure programming language, which has routines, subroutines, and/or functions. The programming language may include for example Python, HTML, XHTML, Java, ADA, XML, C, C++, C#, Pascal, BASIC, API calls, ASP scripts, FORTRAN, COBOL, Perl, .NET, Ruby, and the like.

The input/output (I/O) device(s) may include an input device such as, for example, a mobile device, a keyboard, a mouse, a touchscreen, a microphone, a camera, a scanner, and so forth. The I/O device(s) may include an output device such as, for example, a display, a printer, an email, a text message, and so forth. The I/O device may include devices configurable to communicate both inputs and outputs, such as a router, a telephonic interface, a modulator/demodulator or NIC (that may be suitable to access remote devices, other files, devices, systems, or a network), a radio frequency (RF) or other transceiver, a bridge, and so forth. The I/O devices may include one or more components for communicating over various networks, such as the Internet or intranet.

In aspects, external computers (and respective programming) may be communicably operable with the logic circuit (and thus monitoring module 1000).

In operation of the logic circuit, the microcontroller may: execute software stored within the memory; communicate data to and from the memory; and/or generally control operations of the logic circuit pursuant to the software.

In Operation (with Logic)

The operation of the logic circuit may be further understood with an explanation of the tree diagram of FIG. 2B. The tasks are numbered in above the task name. Task 1 is to acquire data from the sensors 1021. This may include sampling the data from the sensors 1021 over a short time (e.g., 60 seconds) and taking an average and standard deviation. Task 2 compares the standard deviation of the new data with a predetermined acceptable limit saved on a memory of the system. This allows sporadic or outlier data to be excluded. This consequently ensures that, for example, windy conditions will not be interpreted as fouling, and thus preventing false alarms.

If the sampled data is sporadic and not acceptable, a delay (task 5) will be implemented to retry (or loop) for data acquisition. Either the data will be acceptable or will remain sporadic. If the sporadic data is very consistent and the number of sporadic data occurrence exceeds a predefined value (task 3), the user is notified of an error (task 4) (typically an installation error).

Once the sampled data of task 1 has been accepted, it is checked with a lookup-table (LUT) flag (task 6), which is essentially a binary that allows for the completion of the fouling lookup-table. This flag indicates if the fouling lookup-table is already generated and exists or not (Initially and during installation, this flag is false, meaning that the table is not yet generated). If the LUT flag from task 6 is false, the programming uses an averaging method to create a fouling lookup-table containing the data output of the sensors 1021 in a clean condition (tasks 7 and 8). After generating the LUT through multiple iterations (averaging), the system turns the LUT flag true.

If the LUT flag is true, the overall fouling is then calculated in task 9. This consists of referencing acquired data from the sensors 1021 against the fouling lookup-table which represents a clean condition. If fouling is evident, a foul state is recorded (task 10). In task 11, the fouled state is evaluated. If consecutive data has determined that the radiator is in a severe (as defined by the user) fouling condition, then the user will be notified using one or more of the defined warning methods (task 10), e.g., LED, email, J1939 message, etc. If the foul count is not too high, a delay will occur (task 12), and the system will continue to collect data to proactively warn the user in case of any fouling.

Referring now to FIG. 3, a side view of a monitored heat exchanger system that includes a monitoring module, a heat exchanger unit, and a heat generation device, operably coupled together, in accordance with embodiments disclosed herein, are shown. Embodiments herein apply to a heat exchanger unit that may be an inclusive assembly of a number of components and subcomponents. The heat exchanger unit 300 may be part of an overall system 401 that may be monitored. Monitored system 301 includes at least one monitoring module 1000, as described herein. While it need not be exactly the same, system 301 may be like that of system 201 of FIGS. 1A-1C, and components thereof may be duplicate or analogous. Thus, only a brief discussion of system 301 is provided, recognizing that differences, if any, would be discernable by one of skill in the art, especially in view of U.S. Ser. No. 15/477,097 being incorporated herein by reference for all purposes. Accordingly it would be further understood that aspects of system 301 may include various additional improvements related to airflow, noise reduction, cooling efficiency, structural integrity, and combinations thereof.

The HX unit 300 may include one or more cores 306 being associated with respective monitoring module(s) 1000. It should be apparent that while HX unit 300 may have a plurality of sides (or side regions), each of the plurality of sides having respective coolers, not every side need have a monitoring module 1000. Still, it may every well be that every cooler is monitored via one or more modules 1000. Moreover, while the module 1000 may be particularly useful for monitoring fouling, other conditions of the HX unit 300 (or system 301) may be monitored.

One or more cores 306 may be associated with and proximate to a respective protective grate (not viewable), which may be useful for protecting fins of the core 306. The monitoring module 1000 may be installed in place of the grate.

Although not shown in entire detail here, the HX unit 300 may include a fan system. Briefly, the fan system may include related subcomponents, such as a fan that may be understood to include a rotating member with a plurality of fan blades extending therefrom. The fan may be operable by way of a suitable driver, such as a fan motor, which may be hydraulic, electrical, gas-powered, etc. Conduits may be configured for the transfer of pressurized hydraulic fluid to and from the motor. As such, pressurized hydraulic fluid may be used to power the motor.

The fan system may include a fan shroud, which may be generally annular. The fan shroud may be coupled to the frame via connection with the top plate. The shroud may include one or more lateral openings 360 to accommodate the passing of the mount bar 309 therethrough. The mount bar 309 may be a rigid bar or beam that extends from one side 359a of the HX unit 300 to another side 359b.

A fan rock guard 347 may be coupled to a shroud 313. The shroud 313 may be proximate to an aeroring (not shown). The aeroring may be annular in nature, and have a ring cross-section that may have a radius of curvature. Thus, the aeroring may have a rounded surface that may aid in improving airflow and reducing pressure in and around the fan system. Without the aeroring, eddies and other undesired airflow may occur in corners of the top of the frame.

The configuration of the shroud and aeroring may provide added ability for further streamlining airflow, which may beneficially reduce overall power requirements.

The fan system can be operable to draw in and direct the flow of air 316. The air 316 may be drawn through the sides of the HX unit 300 (and respective cores, which may then be used to cool one or more utility fluids F) and out as heated exhaust 318. The benefit of such a configuration is the ability to provide cooling in parallel, versus series. In a series configuration, the airflow becomes progressively hotter as it passes through each cooling circuit, resulting in a loss in cooling efficiency. This can be especially problematic where ambient air temperature is usually hotter, like Texas and Oklahoma.

Utility fluid F (or multiple F's) may include by way of example, lube oil, jacket water, turbo (such as for an engine), transmission fluid (such as for a pump), and hydraulic fluid (such as for the fan drive).

One of skill in the art would appreciate that airflow through the core 306 may be generally in a path parallel to a horizontal axis. In an analogous manner, the fan 308 may have an axis of rotation generally parallel to a vertical axis. Accordingly, airflow through the HX unit 300 may be transitioned from (approximately) horizontal to vertical as the airflow moves through the core 306 and out the fan exhaust 318.

As such, by way of example, utility fluid $F_1$ may be transferred from a heat generating device 303 at a hot temperature into an HX unit inlet 378, cooled with airflow via core 306, and transferred out of an HX unit outlet 384 back to the HGD 303 at a cooler temperature. While not meant to be limited, HGD 303 may be an engine, a genset, a motor, a pump, or other comparable equipment that operates in a manner whereby a utility fluid is heated.

There may be one or more cores 306. A 'cooler' or 'cooling circuit' may include one or more cores 306. The HX unit 300 may have between about 1 to about 8 cooling circuits, which each may be configured for cooling in parallel to each other.

The HX unit 300 may include various sound reduction or integrity features like that as described in pending U.S. patent application Ser. No. 15/477,097, such as various sound baffle configurations and/or flexible mount assemblies.

In operation, a utility fluid F from HGD 303 may be transferred into the HX unit 300. The transfer may be direct or indirect (such as from a holding tank). Within the unit 300, the fluid may flow into a tank chamber (not shown) via inlet 378 of inlet tank. The fluid then distributes into the various alternating layers and respective channels of the core 306.

Similarly airflow 316 may be drawn into HX unit 300, and into the various perpendicular and alternating layers and respective channels of the core 306. The HX unit 300 may be configured for passing atmospheric air through or in contact with the core 306, so as to reduce the temperature of the service fluid circulated through the core 306. In this respect, a fan (or fan system) may be rotatable about a fan axis so as to draw in (or suction, etc.) atmospheric air inwardly through channels (or fins 373), resulting in airflow through the core 306.

The service fluid $F_{1\text{-}hot}$, having a temperature hotter than the airflow, may be cooled (and conversely, the airflow warms). Cooled service fluid $F_{1\text{-}cold}$ leaves the cooling circuit via a fluid outlet 384. Various piping, tubing, etc. may be connected to the tank outlet 384, as may be desired for a particular application, and as would be apparent to one of skill in the art. In some aspects, the tank outlet 384 may be in fluid communication with an inlet of a subsequent cooling circuit also connected with the frame 302.

Cooled utility fluid may be returned from the HX unit 300 to a source tank, or directly to the HGD 303. Thus, service fluid from the HGD 303 may be circulated in a cooling circuit in a systematic and continuous manner. As will be appreciated, a suitable circulating pump (not shown) may be provided to circulate the service fluid through the core cooler 306.

Other coolers of the HX unit 300 may be generally similar in nature, and suitably configured for the cooling of various service fluids from the HGD 303.

Embodiments herein provide for a system (and related method of operating or using the system) using on or more components described herein. For example, such a system may include a wellbore and other wellbore and production equipment, as well as a frac trailer. The frac trailer may include a frac pump, a HGD, and a HX unit as pertaining to the disclosure.

Other embodiments herein provide for a method of doing business related to a monitored heat exchanger system. The method may include the steps of having a customer relationship between a provider and recipient (i.e., customer, client, etc.). The method may include charging a one-time or ongoing fee related to the monitored system. The provider may install the monitored heat exchanger system as a new standalone skid. Alternatively, the provider may retrofit existing equipment for operable communication with a monitoring module as described herein. Thus, in embodiments there may be a first transaction related to equipment purchase or use, followed by a second transaction related to installation.

Another part of transaction, or alternatively, a separate transaction, may pertain to a license for the use software (or programming) related to a logic circuit of the monitoring module, as the provider may own copyright in the respective software (or be an exclusive licensee).

The provider may provide services and equipment directly, or may use a subcontractor.

Once a recipient has completed its applicable transaction, and the system has been associated with at least one monitoring module, the recipient may be provided with the capability to track and monitor one or more characteristics or properties respective to an individual heat exchanger unit performance. Reported information (or parameters) may include percentage of fouling, time between warnings, cleaning frequency, etc). This information may be groupable by location or region to see if one is performing better than another. The system may also indicate them how many units are in green, yellow or red, which may further help identify problem regions, operators etc.

The method may further include a field service component. That is, the provider, or affiliated field service business, may be able to offer (give, etc.) a solution, whereby the monitored system sends out an alarm of some variation, such as SMS/text, email, etc. In this respect the recipient has the option to address the alarm, or have the provider tend to. In other words, in the event the monitored system provides a warning about, for example, a dirty radiator, the recipient is prompted to find a remedy that can alleviate or mitigate process downtime.

The business method may thus include steps pertaining to receiving a warning via the monitoring module, and selecting a remediation option, such as cleaning with dry ice or a pressure washer or in their yard when the pump comes back in from the field. In aspects, these steps may be handled remotely and/or off the jobsite. Accordingly, the recipient need not even have to take any action, as the provider may handle all steps.

The business method may include providing an incentivized transaction if the monitoring module is used with a HX unit that is sold by the provider. The monitoring module may have components as described herein, and the HX unit may likewise have components of any HX unit described herein.

Advantages

Embodiments of the disclosure advantageously provide for an improved heat exchanger unit useable with a wide array of heat generating devices.

Embodiments of the disclosure advantageously provide for new and innovative systems, hardware, software, and related methods, for monitoring a heat exchanger unit. An associated monitoring module may beneficially be retrofitted to existing equipment. Sensors of the module are configured for precision, and in conjunction with a microcontroller, are able together to accurately measure characteristics of a heat exchanger in real-time. In particular, the characteristic may be fouling. The ability to accurately warn of fouling alleviates the need for conventional and cumbersome remediation methods.

The heat exchanger unit of the disclosure may provide for the ability to reduce sound attributable to a point source, such as a fan. The fan may have a dominant acoustic frequency that may be reduced by at least 10 decibels. The heat exchanger unit may be configured with a particular baffle configuration that helps reduce sound. The baffles may be configured to have or contain a sound absorbing material.

At the same time the baffle configuration may help drastically improve streamlined airflow, which further helps reduce sound emission and improves overall efficiency of the heat exchanger unit because of lowered power requirements.

The heat exchanger unit may advantageously provide for the ability to simultaneously cool multiple utility fluids in parallel.

Advantages of the disclosure provide for a compact design with more heat transfer area in limited space, more heat transfer capability, reduced overall height by arranging heat exchanger cores at all four sides in general cube shape.

Embodiments of the disclosure advantageously provide for the ability to improve structural integrity of a heat exchanger unit. A radiator core of the unit may have an increased mass on a core end that may substantially prohibit or eliminate runoff of brazing material during a welding process.

The heat exchanger unit may provide for the ability to provide an 'absorber' effect with any thermal expansion. That is, one or more components may be coupled together via the use of a flex amount assembly, the assembly having a deformable member associated therewith. As thermal expansion occurs, the deformable member may deform resulting to absorb the expansion motion or stress.

Advantages herein may provide for a more convenient and realizable welding practice for core and tank, and a more convenient and flexible mount assembly.

While embodiments of the disclosure have been shown and described, modifications thereof can be made by one skilled in the art without departing from the spirit and teachings of the disclosure. The embodiments described herein are exemplary only, and are not intended to be limiting. Many variations and modifications of the disclosure presented herein are possible and are within the scope of the disclosure. Where numerical ranges or limitations are expressly stated, such express ranges or limitations should be understood to include iterative ranges or limitations of like magnitude falling within the expressly stated ranges or limitations. The use of the term "optionally" with respect to any element of a claim is intended to mean that the subject element is required, or alternatively, is not required. Both alternatives are intended to be within the scope of any claim. Use of broader terms such as comprises, includes, having, etc. should be understood to provide support for narrower terms such as consisting of, consisting essentially of, comprised substantially of, and the like.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the preferred embodiments of the disclosure. The inclusion or discussion of a reference is not an admission that it is prior art to the present disclosure, especially any reference that may have a publication date after the priority date of this application. The disclosures of all patents, patent applications, and publications cited herein are hereby incorporated by reference, to the extent they provide background knowledge; or exemplary, procedural or other details supplementary to those set forth herein.

What is claimed is:

1. A method for monitoring a heat exchanger unit, the method comprising:
    coupling the heat exchanger unit with a heat generating device;
    associating a monitoring module with an airflow side of the heat exchanger unit, the monitoring module comprising:
        an at least one sensor proximate to the airflow side, the at least one sensor having a respective rotating member with a plurality of blades extending therefrom;
        a logic circuit in operable communication with the at least one sensor, and further comprising: a microcontroller configured with computer instructions for performing a set of tasks related to data acquisition and data comparison;
    operating the heat exchanger unit and the heat generating device in a manner whereby an at least one service fluid is transferred therebetween;
    operating the heat exchanger unit whereby a fan draws in ambient air through the airflow side in a sufficient manner to cause a reduction in temperature of the at least one service fluid;
    operating the monitoring module whereby the microcontroller performs the data acquisition and data comparison tasks to resultantly generate an indication related to an amount of fouling on the airflow side, wherein the data acquisition and data comparison pertains to a set of data generated by, and received from, the at least one sensor, and wherein the set of data comprises a signal proportional to an amount of rotation of the rotating member; and taking an action based on the indication.

2. The method for monitoring the heat exchanger unit of 1, wherein the indication is communicated to an end user by way of at least one of: a text message, an email, an audio signal, display, a visual indicator, and combinations thereof.

3. The method for monitoring the heat exchanger unit of claim 2, wherein the monitoring module comprises a plurality of sensors, with each of the plurality of sensors in operable communication with the microcontroller.

4. The method for monitoring the heat exchanger unit of claim 3, wherein the action pertains to cleaning the airflow side.

5. The method for monitoring the heat exchanger unit of claim 3, wherein the monitoring module further comprises each of a solid data storage, a Wi-Fi module, a GSM module, and a CAN-Bus module being disposed within the controller housing and in operable communication with the microcontroller, and wherein the microcontroller is provided with computer instructions for communicating with one or more of the solid data storage, the Wi-Fi module, the GSM module, and the CAN-Bus module.

6. The method for monitoring the heat exchanger unit of claim 3, wherein the at least one service fluid transferable between the heat exchanger unit and the heat generation device comprises one of lube oil, hydraulic fluid, fuel, charge air, transmission fluid, jacket water, and engine cooler, and wherein the heat generation device is a diesel engine, and wherein the heat exchanger unit comprises four sides, each side having a respective cooler mounted to the frame.

7. The method for monitoring the heat exchanger unit of claim 1, wherein the monitoring module further comprises each of a solid data storage, a Wi-Fi module, a GSM module, and a CAN-Bus module being disposed within the controller housing and in operable communication with the microcontroller, and wherein the microcontroller is provided with computer instructions for communicating with one or more of the solid data storage, the Wi-Fi module, the GSM module, and the CAN-Bus module.

8. The method for monitoring the heat exchanger unit of claim 1, wherein the at least one service fluid transferable between the heat exchanger unit and the heat generation device comprises one of lube oil, hydraulic fluid, fuel, and transmission fluid, and wherein the signal is generated by induction.

9. The method for monitoring the heat exchanger unit of claim 1, wherein the set of tasks further comprise:
   acquiring the set of data from the at least one sensor;
   sampling the set of data over a predetermined period of time;
   computing an average and a standard deviation of the set of data;
   comparing the standard deviation with predetermined data;
   determining whether the set of data is acceptable within a defined parameter;
   determining whether a first lookup table comprising a set of lookup data has been completed, and creating the first lookup table using an averaging method if it has not;
   comparing the set of data to the set of lookup data; and
   providing the indication based on a result of the comparing the set of data to the set of lookup data step.

10. A method for monitoring a heat exchanger unit, the method comprising:
    coupling the heat exchanger unit in fluid communication with a heat generating device;
    associating a monitoring module with an airflow side of the heat exchanger unit, the monitoring module comprising:
        a plurality of sensors, each having a respective rotating member with a plurality of blades extending therefrom;
        a logic circuit in operable communication with the plurality of sensors, and further comprising: a microcontroller operable with computer instructions for performing a set of tasks related to data acquisition and data comparison;
    operating the heat exchanger unit and the heat generating device in a manner whereby an at least one service fluid is transferred therebetween;
    operating the heat exchanger unit whereby a fan draws in ambient air through the airflow side in a sufficient manner to cause a reduction in temperature of the at least one service fluid, wherein the drawn in ambient air impacts the plurality of blades of at least one rotating member resulting in rotation thereof;
    operating the monitoring module whereby the microcontroller performs the data acquisition and data comparison tasks to resultantly generate an indication related to an amount of fouling on the airflow side; and
    performing a cleaning action on the heat exchanger unit.

11. The method for monitoring the heat exchanger unit of claim 10, the method comprising the step of operating the monitoring module to communicate the indication to an end user by way of at least one of: a text message, an email, an audio signal, display, a visual indicator, and combinations thereof, wherein the heat generation device is a diesel engine, wherein the diesel engine is operably coupled to a frac pump, and wherein the heat exchanger unit, the diesel engine, and the frac pump are disposed on a frac truck.

12. The method for monitoring the heat exchanger unit of claim 10, wherein the monitoring module further comprises each of a solid data storage, a Wi-Fi module, a GSM module, and a CAN-Bus module being disposed within the controller housing and in operable communication with the microcontroller, and wherein the microcontroller is provided with computer instructions for communicating with one or more of the solid data storage, the Wi-Fi module, the GSM module, and the CAN-Bus module.

13. The method for monitoring the heat exchanger unit of claim 12, wherein the at least one service fluid comprises one of lube oil, hydraulic fluid, fuel, and transmission fluid.

14. The method for monitoring the heat exchanger unit of claim 13, wherein the set of tasks further comprise:
    i) acquiring a set of data from an at least one of the plurality of sensors;
    ii) sampling the set of data over a predetermined period of time;
    iii) determining whether the set of data is acceptable within a defined parameter;
    iv) determining whether a first lookup table comprising a set of lookup data has been completed;
    v) establishing the first lookup table;
    vi) comparing the set of data to the set of lookup data; and
    vii) providing the indication based on a result of the comparing the set of data to the set of lookup data.

15. The method for monitoring the heat exchanger unit of claim 12, wherein the set of tasks further comprise:
    i) acquiring a set of data from an at least one of the plurality of sensors;
    ii) sampling the set of data over a predetermined period of time;
    iii) determining whether the set of data is acceptable within a defined parameter;
    iv) determining whether a first lookup table comprising a set of lookup data has been completed;
    v) establishing the first lookup table;
    vi) comparing the set of data to the set of lookup data; and
    vii) providing the indication based on a result of the comparing the set of data to the set of lookup data.

16. A method for monitoring the heat exchanger unit, the method comprising:
    operating a heat exchanger unit and a heat generating device in a manner whereby an at least one service fluid is transferred therebetween;
    associating a monitoring module with an airflow side of the heat exchanger unit, the monitoring module comprising:
        a plurality of sensors, at least one of which has a respective rotating member with a plurality of blades extending therefrom;
        a logic circuit in operable communication with the plurality of sensors, and further comprising: a microcontroller operable with computer instructions for performing the tasks of:
            i) acquiring a set of data from at least one of the plurality of sensors;
            ii) sampling the set of data over a predetermined period of time;
            iii) determining whether the set of data is acceptable within a defined parameter;
            iv) determining whether a first lookup table comprising a set of lookup data has been completed;
            v) establishing the first lookup table;
            vi) comparing the set of data to the set of lookup data; and
            vii) providing an indication based on a result of the comparing the set of data to the set of lookup data step; and
    initiating operation of the monitoring module whereby the microcontroller performs tasks i)-vii);

operating the heat exchanger unit whereby a fan draws in ambient air through the airflow side in a sufficient manner to cause a reduction in temperature of the at least one service fluid; and based on the indication, performing an action on the heat exchanger unit.

17. The method for monitoring the heat exchanger unit of claim 16, the method comprising the step of receiving the indication way of at least one of: a text message, an email, an audio signal, display, a visual indicator, and combinations thereof, wherein the indication is related to an amount of fouling present within the airflow side, wherein at least one of the plurality of sensors comprises a rotor shaft proximate to a sensor stator housing, wherein the set of data comprises a signal proportional to an amount of rotation of the shaft, and wherein the signal is created by way of induction.

18. The method for monitoring the heat exchanger unit of claim 16, wherein the monitoring module further comprises each of a solid data storage, a Wi-Fi module, a GSM module, and a CAN-Bus module being disposed within the controller housing and in operable communication with the microcontroller, and wherein the microcontroller is provided with computer instructions for communicating with one or more of the solid data storage, the Wi-Fi module, the GSM module, and the CAN-Bus module.

19. The method for monitoring the heat exchanger unit of claim 18, wherein the at least one service fluid comprises one of lube oil, hydraulic fluid, fuel, and transmission fluid, wherein the heat generation device is a diesel engine, wherein the diesel engine is operably coupled to a frac pump, and wherein the heat exchanger unit, the diesel engine, and the frac pump are disposed on a frac truck.

20. The method for monitoring the heat exchanger unit of claim 19, wherein the heat generation device is a diesel engine, and wherein the heat exchanger unit comprises four sides, each side having a respective cooler mounted to the frame.

* * * * *